(12) United States Patent
Saito et al.

(10) Patent No.: US 7,684,781 B2
(45) Date of Patent: Mar. 23, 2010

(54) SEMICONDUCTOR DEVICE

(75) Inventors: Toshihiko Saito, Atsugi (JP); Kiyoshi Kato, Atsugi (JP); Takehisa Sato, Isehara (JP)

(73) Assignee: Semiconductor Energy Laboratory Co., Ltd, Atsugi-shi, Kanagawa-ken (JP)

( * ) Notice: Subject to any disclaimer, the term of this patent is extended or adjusted under 35 U.S.C. 154(b) by 617 days.

(21) Appl. No.: 11/592,251

(22) Filed: Nov. 3, 2006

(65) Prior Publication Data

US 2007/0120751 A1 May 31, 2007

(30) Foreign Application Priority Data

Nov. 25, 2005 (JP) .............................. 2005-340981

(51) Int. Cl.
*H04B 1/38* (2006.01)
*H04Q 7/20* (2006.01)

(52) U.S. Cl. .................... 455/333; 235/492; 257/781; 343/702; 365/185.17

(58) Field of Classification Search ............... 455/333, 455/558; 235/440, 492; 257/781; 340/572.1; 343/702; 365/185.17
See application file for complete search history.

(56) References Cited

U.S. PATENT DOCUMENTS

| | | | |
|---|---|---|---|
| 5,528,222 A | 6/1996 | Moskowitz et al. | |
| 5,926,110 A * | 7/1999 | Downs et al. | 340/10.51 |
| 6,552,694 B1 * | 4/2003 | Fujii et al. | 343/895 |
| 6,848,620 B2 | 2/2005 | Nakane et al. | |
| 2003/0174839 A1 | 9/2003 | Yamagata et al. | |
| 2004/0164302 A1 | 8/2004 | Arai et al. | |
| 2005/0128807 A1 * | 6/2005 | Chen et al. | 365/185.17 |
| 2005/0133790 A1 | 6/2005 | Kato | |
| 2006/0027936 A1 * | 2/2006 | Mizukoshi et al. | 257/781 |

FOREIGN PATENT DOCUMENTS

| | | |
|---|---|---|
| JP | 08-088586 | 4/1996 |
| JP | 2000-011129 | 1/2000 |
| JP | 2000-151057 | 5/2000 |
| JP | 2003-016418 | 1/2003 |
| WO | WO 2005/093647 | 10/2005 |
| WO | WO 2006/043573 | 4/2006 |
| WO | WO 2006/057417 | 6/2006 |

OTHER PUBLICATIONS

Office Action (Application No. 200610163750.6) Dated Oct. 23, 2009.

* cited by examiner

*Primary Examiner*—Lee Nguyen
(74) *Attorney, Agent, or Firm*—Eric J. Robinson; Robinson Intellectual Property Law Office, P.C.

(57) ABSTRACT

An object is to reduce troubles during pressure bonding of an antenna in a wireless chip including a thin film. A wireless chip made from a thin film is formed, in particular a wireless chip including a memory area including an organic compound layer, and a distance between the memory area and a pad is a prescribed value or longer. As a result, data writing can be carried out without being affected by stress or heat during pressure bonding of the antenna. For a substrate over which the wireless chip is provided, a glass substrate or a silicon wafer can be used.

24 Claims, 19 Drawing Sheets

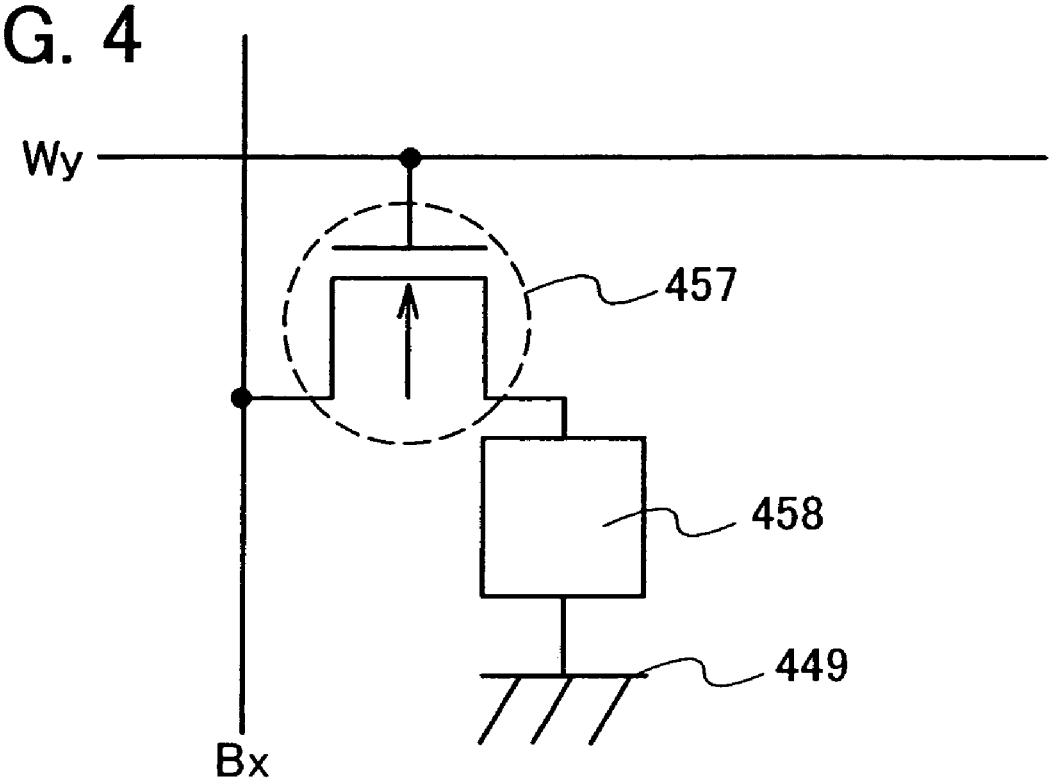

650

FIG. 13A
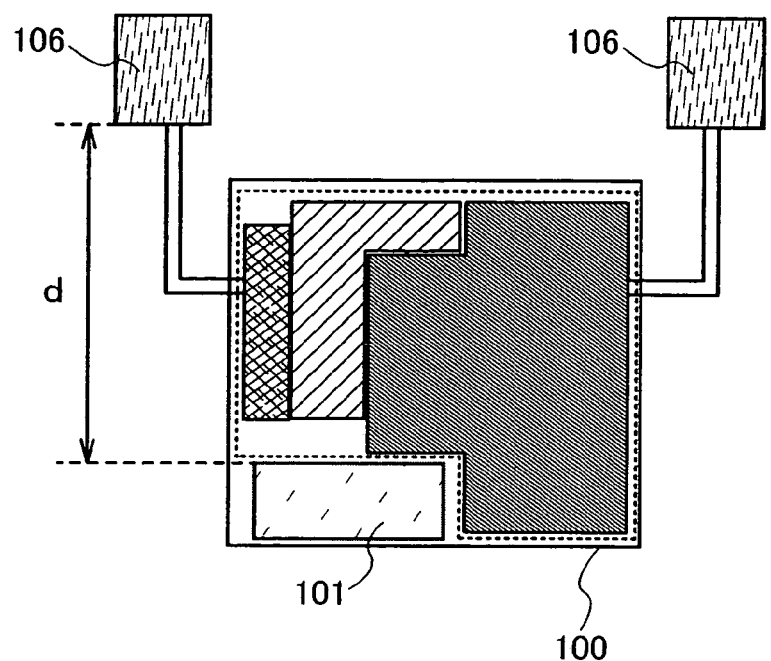
FIG. 13B  d=-250μm
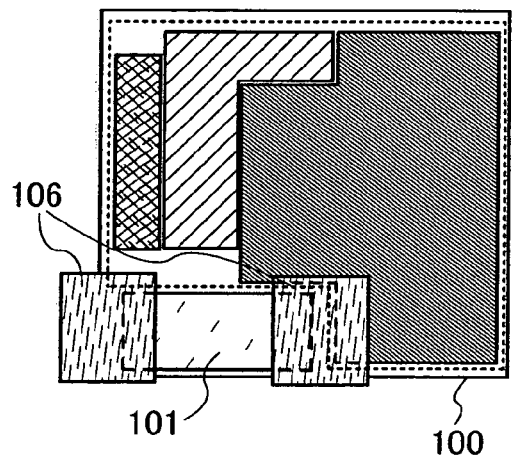
FIG. 13C  d=750μm
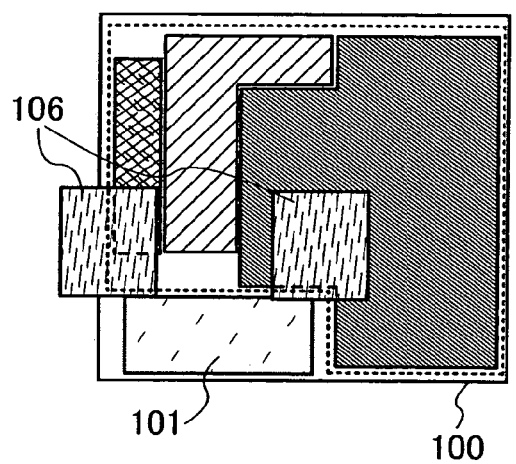

SEMICONDUCTOR DEVICE

BACKGROUND OF THE INVENTION

1. Field of the Invention

The present invention relates to a semiconductor device that carries out input/output of information by wireless communication, and particularly relates to a circuit arrangement and a wire connection structure thereof.

2. Description of the Related Art

A semiconductor device having a wireless communication function is called an ID tag, an IC tag, an IC chip, an RF (Radio Frequency) tag, a wireless tag, or an electronic tag, depending on its use. Among semiconductor devices of such use, one in which a communication circuit or a memory is structured by a semiconductor integrated circuit is also called a wireless chip.

A structure of a wireless chip includes an interface, a memory, a control portion, and the like. As the memory, a random access memory (hereinafter also referred to as "RAM") capable of writing and reading, and a read only memory (hereinafter also referred to as "ROM") only for reading are used separately according to a purpose. Specifically, a memory area is assigned for every particular application, and access privilege is managed for every application and every directory. In order to manage access privilege, the wireless chip includes a verifying means which compares with a private code of an application, as well as a control means which gives a user access privilege to the application when the private code is matched as a result of comparison and verification by the verifying means (refer to Patent Document 1: Japanese Published Patent Application No. 2003-16418).

Such a wireless chip is formed from a silicon wafer, and an integrated circuit of a memory circuit, a arithmetic circuit, and the like are formed over a circuit side of a semiconductor substrate (refer to Patent Document 2: Japanese Published Patent Application No. 2000-11129).

The wireless chip formed from a silicon wafer is in a face-down state and connected to an antenna. For example, a chip formed over a flexible substrate has a bump as a contact terminal, and is connected in a face-down state to an antenna provided over another substrate (refer to Patent Document 3: Japanese Published Patent Application No. H8-88586). Alternatively, by applying pressure to a semiconductor element over which a bump is formed, the bump connects to a wiring sheet by pressure in a face-down state (refer to Patent Document 4: Japanese Published Patent Application No. 2000-151057).

When a card to which such a wireless chip is mounted (a so-called IC card) is compared to a magnetic card, the IC card has advantages of having a large memory capacity and high authenticity, as well as advantages that it can be equipped with a arithmetic function, and that it is extremely difficult to falsify. Consequently, it is employed by local governments and the like, and it is suitable for managing personal information.

SUMMARY OF THE INVENTION

Wireless chips are manufactured using expensive silicon wafers, as are microprocessors and semiconductor memories. Therefore, there is naturally a limit in reducing a unit price of a chip. In particular, a memory area necessary for a wireless chip occupies a large area within the chip, and reducing the area which the memory area occupies without changing a memory capacity is necessary in order to reduce the unit price of a chip.

Further, a conventional wireless chip is not suitable to be attached to a substratum of a curved-surface shape even if it is a smaller piece since it uses silicon for a structure. Although there is a method in which a silicon wafer itself is ground and polished to be thinned, this increases the number of steps, which does not make sense in terms of cost reduction. Even if the silicon wafer is thinned, when a wireless chip such as an IC tag used by attaching to a product is attached to a thin piece of paper, a protrusion is formed on a surface which is uncomfortable for a user.

According to a conventional technique, in order to identify each wireless chip, identification information must be stored in a ROM within the wireless chip, which adds a wire connection step and there is a loss in productivity. Further, in this wire connection step, a chip, in particular a logic circuit portion, is sometimes destroyed when an antenna is connected to a chip by pressure bonding.

The present invention is made in view of the foregoing situation, and an object of the present invention is to improve productivity of a semiconductor device having a wireless communication function while achieving reduction in thickness of the semiconductor device.

In view of the foregoing problem, in the present invention, a wireless chip made from a thin film is formed; in particular, a memory area including an organic compound layer, in other words a memory element, is formed in the wireless chip. The memory element includes an organic compound layer interposed between a pair of electrodes. Each of the electrodes included in the memory is provided with a switching element, and the memory is a so-called active type memory. The organic compound layer is a layer including an organic material, and may have a structure in which layers having different functions are stacked, or it may have a single layer structure.

Such a memory can be formed over the same substrate with a circuit or the like structuring the wireless chip. Consequently, the wireless chip can be provided with the memory without adding a manufacturing step or increasing manufacturing cost.

For such a new wireless chip made from a thin film, a pad to which an antenna is connected by pressure bonding is provided outside of an element forming region. It is preferable that a linear distance between the pad and the region in which the organic compound layer structuring the memory element is provided (hereinafter referred to as memory area) is 500 µm or more, preferably 750 µm or more, or from 500 µm to 1 mm when expressed as a range. When the antenna is pressure-bonded, a pressure of 30 kPa to 60 kPa is applied until it is connected, while heating at a temperature of 100° C. to 350° C.

The present invention is a semiconductor device including an antenna for carrying out wireless communication; a logic circuit portion and a high frequency circuit portion connected to the antenna; a memory circuit portion controlled by the logic circuit portion; and a pad portion that connects the high frequency circuit portion and the antenna; in which one end portion of the memory circuit portion and the pad portion are provided to have distance therebetween, and by which input/output of information is possible without contact.

A specific structure of the present invention is described below.

One aspect of the present invention is a semiconductor device including an antenna for carrying out wireless communication; a logic circuit portion and a high frequency circuit portion connected to the antenna; a memory circuit portion controlled by the logic circuit portion; and a pad portion that connects the high frequency circuit portion and the antenna. In addition, a distance between one end portion of the memory circuit portion and the pad portion is at least 500 µm or longer in linear distance.

Another aspect of the present invention is a semiconductor device including an antenna for carrying out wireless communication; a logic circuit portion and a high frequency circuit portion connected to the antenna; a memory circuit portion controlled by the logic circuit portion; and a pad portion that connects the high frequency circuit portion and the antenna. In addition, a distance between one end portion of the memory circuit portion and the pad portion is at least 750 µm or longer in linear distance.

Another aspect of the present invention is a semiconductor device including an antenna for carrying out wireless communication; a logic circuit portion and a high frequency circuit portion connected to the antenna; a memory circuit portion controlled by the logic circuit portion; and a pad portion that connects the high frequency circuit portion and the antenna. In addition, a distance between one end portion of the memory circuit portion and the pad portion is at least from 500 µm to 1 mm in linear distance. This distance is not affected by chip size. Also the one end portion of the memory circuit portion is where an opening is provided for film formation or wire contact, that is, a side of which physical strength is relatively weak.

In the present invention, an antenna may have a straight line shape, or the antenna may have a coil shape. Such an antenna is provided over an antenna substrate and is pressure-bonded to a pad. During pressure bonding, the antenna is pressure-bonded to the pad using an anisotropic conductive film.

In the present invention, a memory area includes a plurality of memory cells, and each of the memory cells includes a switching element and a memory element.

In the present invention, a memory element includes an organic compound layer between a first conductive layer structuring a bit line and a second conductive layer structuring a word line.

According to the present invention, productivity can be improved by using an organic memory element that can be written once by voltage as a ROM of a wireless chip.

According to the present invention, by providing a high frequency circuit portion in an integrated circuit formed from a thin film transistor, a pad portion to which an antenna which carries out wireless communication is bonded, and a memory area in the integrated circuit so that there is distance therebetween, the integrated circuit and the antenna can be formed in a thin film state over the same substrate. Degradation of an organic memory element in the memory area due to stress can be prevented even after going through a step of pressure-bonding the antenna and the pad portion and a step of peeling the integrated circuit formed from a thin film transistor from a substrate.

In this manner, according to the present invention, a semiconductor device in which the antenna and the integrated circuit in a thin film state are formed over the same substrate and by which wireless connection is possible can be obtained.

With the wireless chip made from a thin film, thickness can be reduced more and flexibility can be improved compared to a wireless chip made from a silicon wafer.

In a wireless chip with excellent flexibility, by providing a pad outside of an element forming region and preferably providing the pad away from a memory area, destruction or deformation of an element during pressure bonding of an antenna can be prevented. As a result, malfunction of the wireless chip can be prevented.

BRIEF DESCRIPTION OF DRAWINGS

FIG. 4 is a circuit diagram showing a memory element of the present invention;

FIGS. 13A to 13C are each a figure showing a condition of an experiment;

FIGS. 14A and 14B are each a figure showing a result of an experiment;

FIGS. 15A to 15C are each a figure showing a result of an experiment;

FIGS. 16A to 16C are each a figure showing a result of an experiment;

FIGS. 17A to 17C are each a figure showing a result of an experiment;

DETAILED DESCRIPTION OF THE INVENTION

Embodiment Mode

Figure 1A:
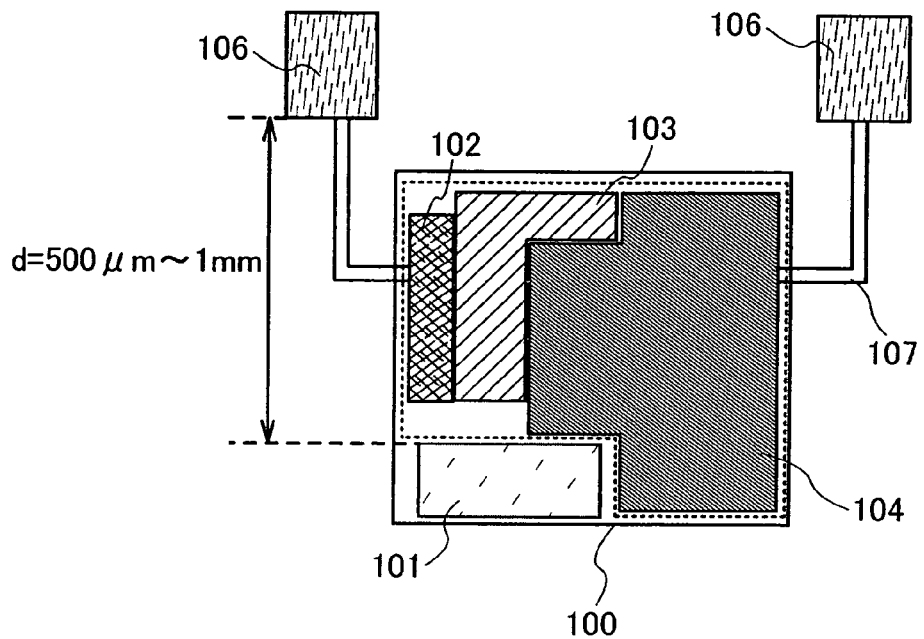
FIGS. 1A and 1B are each a top view showing a wireless chip of the present invention.

Embodiment modes of the present invention will hereinafter be described based on the accompanying drawings. However, the present invention can be carried out in many different modes, and it is easily understood by those skilled in the art that modes and details herein disclosed can be modified in various ways without departing from the spirit and the scope of the present invention. Therefore, the present invention should not be interpreted as being limited to the description of the embodiment modes to be given below. Note that in all drawings for describing the embodiment modes, the same reference numerals are used for the same portions or the portions having similar functions, and the repeated description thereof is omitted.

Embodiment Mode 1

In this embodiment mode, a structure of a wireless chip including an organic memory is described. Note that in this embodiment mode, only a structure of a wireless chip is mentioned; however, by providing an antenna according to a communication frequency, wireless communication is possible.

FIG. 1A shows a wireless chip 100. A memory area 101, a high frequency circuit portion including an external signal input portion 102, an RF input portion 103, and the like; and a logic circuit portion 104 are included in the chip, and pads 106 are provided outside of the chip.

The memory area 101 is a region in which information is written, and in which a ROM or a RAM is provided. In this embodiment mode, information specific to the wireless chip is written in the ROM. The ROM is a so-called write-once type in which rewriting is not possible. Therefore, information that does not need to be rewritten such as information specific to the wireless chip, or information that would cause problems if rewritten is written. A memory capacity of about 64 bits is enough for writing information specific to the wireless chip; however, the present invention is not limited thereto, and a memory capacity of 64 bits or more may be provided. On the other hand, the RAM is a rewritable memory, and in which information obtained in a distribution process of the wireless chip may be written.

In the present invention, the foregoing ROM is formed from a memory including an organic compound layer. The memory includes an organic compound layer interposed between a pair of electrodes, and the electrodes included in the memory are each provided with a switching element. A so-called active type memory is provided as the ROM.

The external signal input portion 102 has a function of inputting signals for writing in the memory area, and for example includes a power supply and a plurality of pads for inputting control signals.

The RF input portion 103 has a function of generating a power supply and a clock from electric waves received from an antenna, and for example includes a power supply circuit, a clock generator, a demodulation circuit, a modulation circuit, and the like.

The logic circuit portion 104 has a function of generating control signals using the foregoing power supply and the foregoing clock, and for example includes a controller or a CPU.

In the present invention, the pads 106 are provided outside of the wireless chip. In other words, an element of a circuit having a specific function is not formed under each of the pads 106. Therefore, the pads 106 are connected to a circuit in the wireless chip via wires 107. Such wires as the wires 107 are called leading wires. Compared to a wire that connects elements in the wireless chip, the leading wire is extremely long. Therefore, the leading wires are preferably formed from a material having lower resistance than that of the wire that connects elements in the wireless chip.

A linear distance (hereinafter simply referred to as distance) d between each of the pads 106 and the memory area 101 of the wireless chip as shown in FIG. 1A is 500 μm or longer, preferably 750 μm or longer, or from 500 μm to 1 mm when expressed as a range. This distance is an absolute value, and it is preferably maintained even when a size of the wireless chip is reduced. In the present invention, a distance between the pad and the memory area refers to a distance between one side end portion of the memory area and one side end portion of the pad, and points to the shortest linear distance. When antennas are pressure-bonded, a pressure of 30 kPa to 60 kPa is applied until they are connected, while heating at a temperature of 100° C. to 350° C. In the present invention, "pressure bonding" means applying pressure to an object while the object is being heated, and it is also called "thermocompression". Such pressure that occurs during pressure-bonding of the antennas occurs not only over the pads 106, but also propagates to a periphery thereof. This propagation is significantly affected in the wireless chip formed over a film substrate. This is because the film substrate deforms easily during pressure bonding. Therefore, it is preferable to proactively create distance between the memory area 101 in the wireless chip and the pad 106. Also, the distance between the memory area and the pad is a distance from where an opening is provided for a wire contact or formation of the memory area, in other words where physical strength is relatively weak, to the pad. In other words, by creating distance between the memory area and the pad, degradation of the organic memory by heat during pressure bonding can be prevented.

Figure 1B:
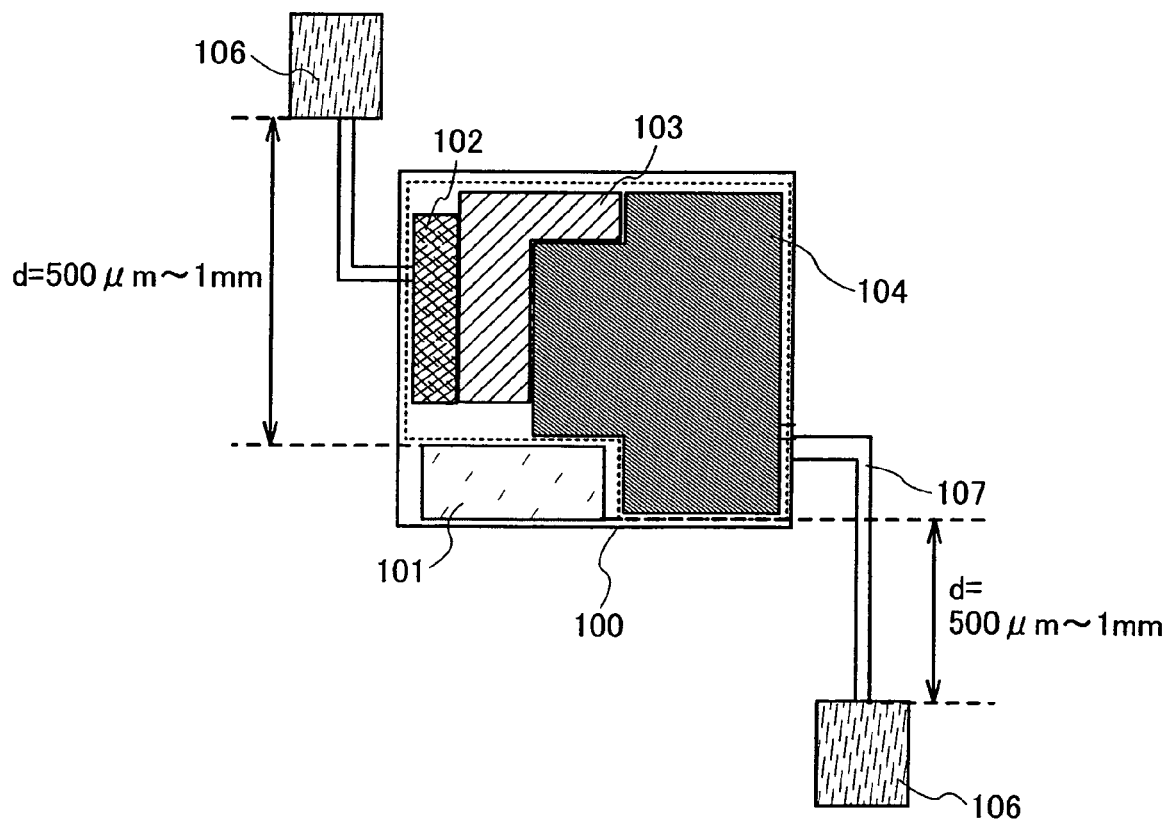

In FIG. 1A, the pads are provided outside of the wireless chip and are aligned along one end of the wireless chip. However, since a point of the present invention is to provide the pads outside of the wireless chip, it is not limited to a structure of arranging the pads so as to be aligned along one end of the wireless chip. For example, as shown in FIG. 1B, the pads may be provided along opposing sides of the wireless chip and outside of the wireless chip. In a mode of the wireless chip in which a plurality of pads are provided and in which their positions differ as shown in FIG. 1B, the distance d between each of the pads 106 and the memory area 101 of the wireless chip is preferably 500 μm or longer, preferably 750 μm or longer, or from 500 μm to 1 mm when expressed as a range. This distance is not affected by chip size.

Embodiment Mode 2

In this embodiment mode, a mode of a wireless chip provided with an antenna is described.

Figure 2A:
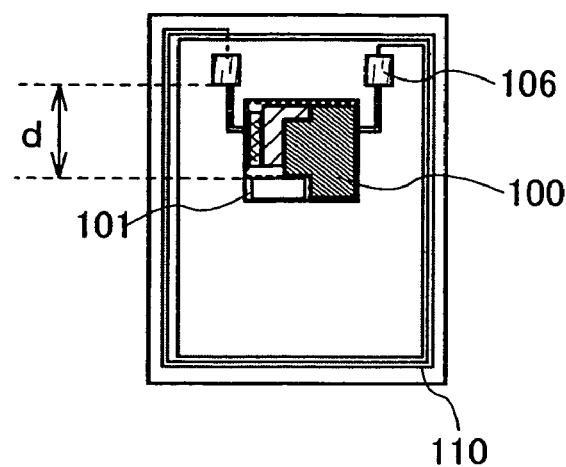
FIGS. 2A to 2C are each a figure showing a wireless chip of the present invention.

FIG. 2A shows a mode in which a coil-shaped antenna 110 responding to a data transfer method of an electromagnetic induction method is connected to the wireless chip 100 via the pads 106. The electromagnetic induction method has features of wide directivity of the antenna and wide communication range. For a frequency band, a low frequency band such as 135 kHz or a high frequency band such as 13.56 MHz is used. Communication distance is from several centimeters to several tens of centimeters. A distance between each of the pads 106 and the memory area 101 is 500 μm or longer, preferably 750 μm or longer, or from 500 μm to 1 mm when expressed as a range. With such a structure, destruction or deformation of the wireless chip, in particular the memory area, during attachment of the antenna can be prevented.

Figure 2B:
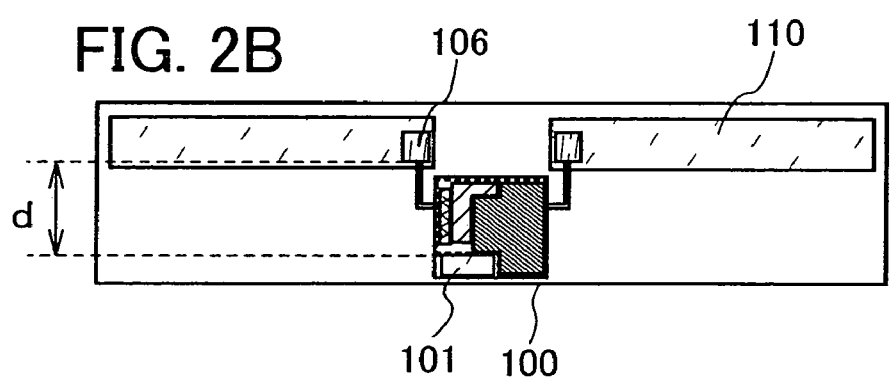

FIG. 2B shows a mode in which a dipole antenna 110 is connected to the wireless chip 100 via the pads 106. A distance between each of the pads 106 and the memory area 101 is 500 μm or longer, preferably 750 μm or longer, or from 500 μm to 1 mm when expressed as a range. Although the dipole antenna is also omnidirectional, a communication distance can be widened to about 1 to 6 meters by using an ultra high frequency band (UHF band) of a 900 MHz band (for example, 950 to 956 MHz). Also, by using a 2.45 GHz band, communication with high directivity can be carried out. Further, if it is acceptable that communication distance is short, the antenna can be downsized; consequently, along with high directivity, highly secure wireless identification or the like can be carried out. With such a structure, destruction or deformation of the wireless chip, in particular the memory area, during attachment of the antenna can be prevented.

The distance between each of the pads 106 and the memory area 101 in each of FIGS. 2A and 2B is an absolute value regardless of a shape of the antenna or size of the wireless chip, and this distance is preferably maintained.

Figure 2C:
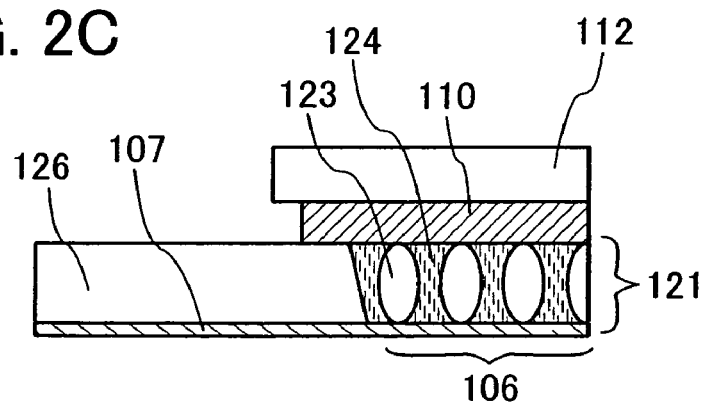

FIG. 2C shows an enlarged view of a pad 106 portion, and shows a schematic view of a connection between the pads 106 and the antenna 110. The pads 106 and the wires 107 can be formed of the same material, which may be a low resistance conductive material. The wires 107 are leading wires, and a low resistance material is desirable. Also, a low resistance material is desired for the pads 106 since they are contact regions with the antenna 110, and also to reduce loss from the antenna. By providing an insulating layer 126 having an open portion over each of the pads 106, confirming an attachment position of the antenna when the antenna 110 is pressure-bonded can be made to be simple. The insulating layer 126 can be formed from a known inorganic material or organic material. At the open portion of the insulating layer 126, a side surface of the insulating layer 126 may be slanted. In the open portion, an ACF (Anisotropic Conductive Film) 121 including conductors 123 and an adhesive organic material 124 is placed, and the antenna 110 and the pads 106 are connected. Also, the antenna 110 and the pads 106 can be connected by using a conductive adhesive agent such as a silver paste, a copper paste, or a carbon paste; an NCP (Non Conductive Paste); a solder joint; or the like. It is preferable that the antenna 110 is formed over an antenna substrate 112 that is made of a flexible substrate. Of course, the antenna 110 may be formed over a different substrate. By using a quartz substrate or a glass substrate with high degree of hardness, pressure bonding can be simplified.

A wireless chip made from such a thin film can be formed over a flexible substrate. As a result, a semiconductor device with improved flexibility can be provided. As the semiconductor device, an IC card, an IC tag, or the like can be given.

Embodiment Mode 3

In this embodiment mode, an example of a mask layout of a wireless chip is described.

Figure 11A:
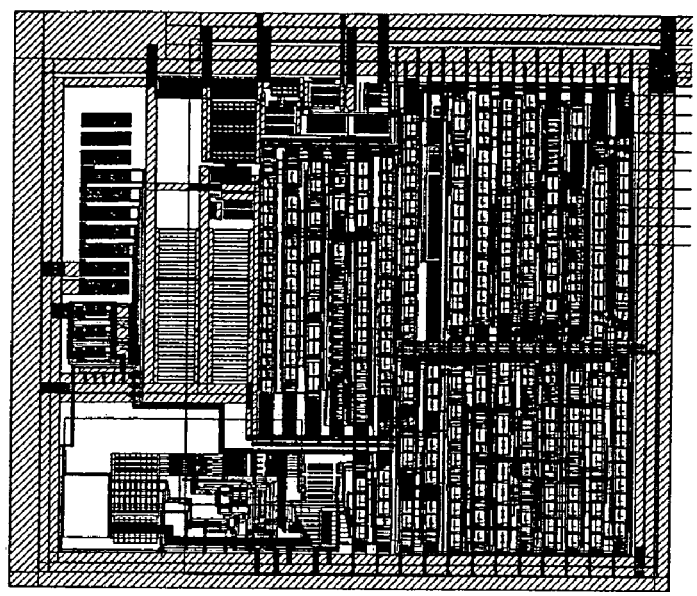
FIGS. 11A and 11B are each a top view showing a wireless chip of the present invention.
Figure 11B:
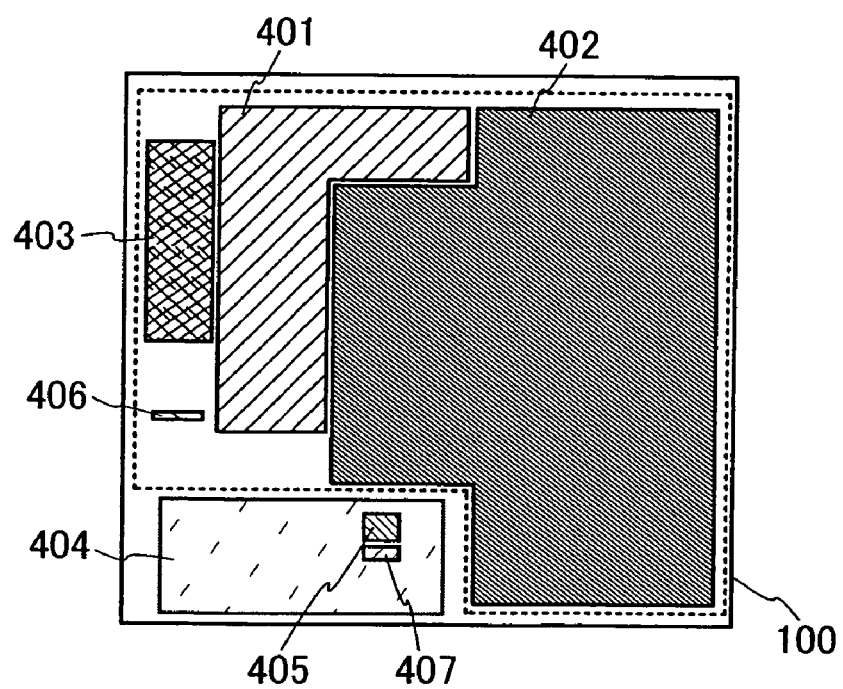

FIG. 11A shows an example of a mask layout of a wireless chip, and FIG. 11B shows a block diagram thereof.

In the wireless chip, a logic circuit portion 402 which occupies the largest area is provided, and an RF input portion 401 and a memory area 404 are provided adjacently to the logic circuit portion 402. In one region of the memory area 404, a regulator circuit portion 405 and a resistor 407 are provided to be adjacent to each other. An external signal input portion 403 is provided adjacently to the RF input portion 401. Since the external signal input portion 403 has a pad, it is favorable to be provided in a region that is in contact with one side of the wireless chip 100. This is because, during connected to the pad, the side of the wireless chip can be used as a reference point for attaching the pad.

At this time, a distance between the pad and the memory area is 500 μm or longer, preferably 750 μm or longer, or from 500 μm to 1 mm when expressed as a range. That is, the memory area of the chip and the pad are formed so as at least not to overlap each other. Preferably, a wire extending from the pad (a leading wire) and the memory area are formed so as not to overlap each other. Consequently, stress or heat during pressure bonding of an antenna can be prevented from being propagated through the leading wire and being applied to the memory area.

A more preferable structure is that in which a circuit having a specific function other than the memory area also does not overlap with the pad. In other words, an element of the circuit having a specific function is not formed under the pad. As a result, data processing can be carried out without being affected by stress or heat during pressure bonding of the antenna.

FIG. 11B shows an arrangement of the RF input portion 401, the logic circuit portion 402, the external signal input portion 403, the memory area 404, the regulator circuit portion 405, a diode 406, and the resistor 407 in a block diagram.

These circuits and the like can be formed by the manufacturing method described in the above embodiment mode.

With such a wireless chip, data writing can be carried out without being affected by stress or heat during pressure bonding of the antenna.

Embodiment Mode 4

In this embodiment mode, a structure of a wireless chip and an operation thereof are described.

Figure 5A:
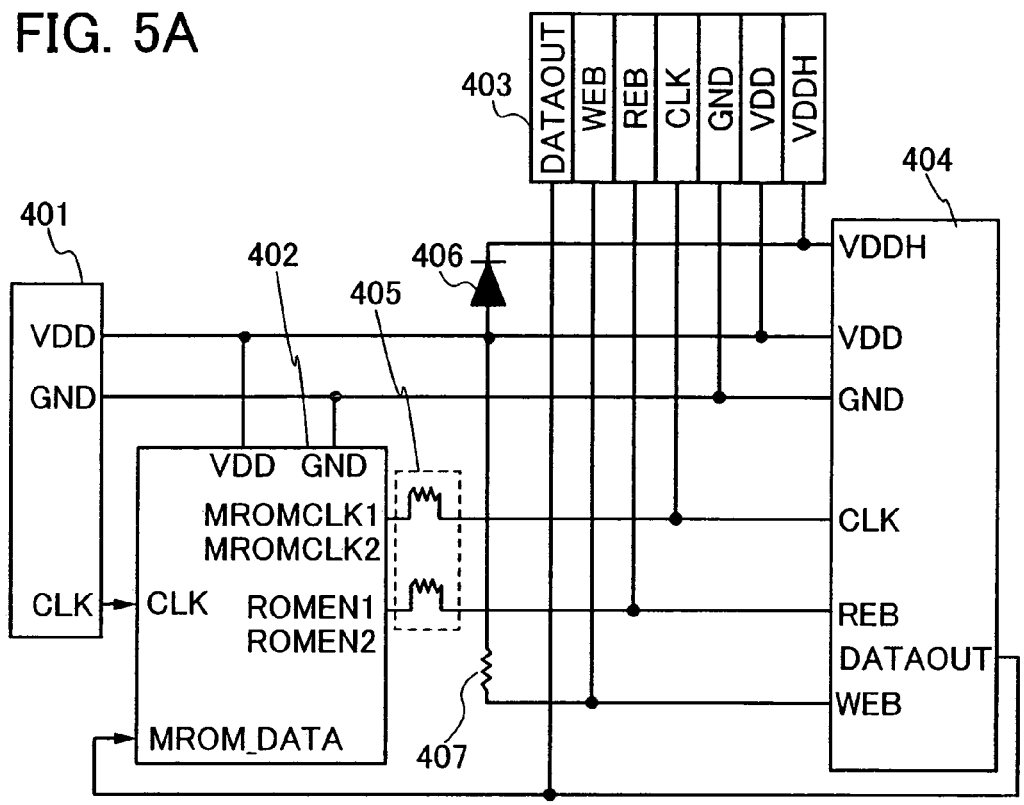
FIGS. 5A and 5B are each a circuit diagram showing a wireless chip of the present invention.

As shown in FIG. 5A, a wireless chip includes the RF input portion 401, the logic circuit portion 402, the external signal input portion 403, the memory area 404, and the regulator circuit portion 405.

The RF input portion 401 includes a high potential side power supply (VDD) terminal, a low potential side power supply terminal, and a clock signal (CLK) terminal. In this embodiment mode, for the low potential side power supply, a ground potential (GND) is used. The RF input portion 401 rectifies electric waves received from an antenna (not shown in the figure) to generate VDD, as well as generate CLK by frequency dividing the received electric waves. The RF input portion 401 can include another power supply circuit, a clock generator, a demodulation circuit, and a modulation circuit. The power supply circuit includes a rectification circuit and a storage capacitor, and can generate power supply voltage. The demodulation circuit includes an LPF (Low Pass Filter), and can extract data from wireless signals. The modulation circuit can superimpose data on wireless signals by a Manchester coding method.

The logic circuit portion 402 is connected to the foregoing high potential side power supply and the ground potential, and the foregoing clock signals are input. The logic circuit portion 402 can include a controller or a CPU in addition. The controller includes a wireless communication interface, a clock control circuit, a control register, a reception data register, a transmission data register, a CPU interface and the like. The demodulation circuit and the modulation circuit can exchange signals with the control register, the reception data register, and the transmission data register via the wireless communication interface. The clock generator is controlled by the clock control circuit, and the clock control circuit is operated based on the control register. The control register, the reception data register, and the transmission data register can exchange signals with the CPU via the CPU interface.

A plurality of pads are provided in the external signal input portion 403. For example, the external signal input portion 403 includes a signal output (DATAOUT) pad, a writing signal input (WEB) pad, a reading signal input (REB) pad, a clock signal (CLK) pad, a ground potential (GND) pad, a high potential side power supply (VDD) pad, and a writing power supply (VDDH) pad.

The memory area 404 is provided with a VDDH terminal to which signals are input via the VDDH pad; a VDD terminal to which signals are input via the VDD pad; a GND terminal to which signals are input via the GND pad; a CLK terminal to which signals are input via the CLK pad; an REB terminal to which signals are input via the REB pad, and a WEB terminal to which signals are input via the WEB pad. In the memory area, a ROM or a RAM is formed as a memory element. Also, the ROM or the RAM can carry out an exchange with the control register, the reception data register, and the transmission data register via the CPU interface.

In the memory area, the regulator circuit portion 405 for regulating the ROM or the RAM is provided. The regulator circuit portion 405 includes a plurality of resistors. For example, the CLK terminal of the memory area 404 and MROMCLK terminal 1 and 2 of the logic circuit portion 402 are connected via any one of the resistors. Further, for example, the REB terminal of the memory area 404 and ROMEN (ROM Enable) terminal 1 and 2 of the logic circuit portion 402 are connected via any resistor other than the resistor. Such a regulator circuit portion 405 regulates so that unnecessary control signals are not input to the memory area 404 from the logic circuit portion 402, when data is written to or read from the memory area 404 using external signals.

Further, the resistor 407 is a pull-up circuit, and functions as a regulator circuit. The regulator circuit portion 405 regulates so that unnecessary control signals are not input to the memory area 404 from the logic circuit portion 402, when data is written to the memory area 404. Similarly, the resistor 407 also regulates so that signals are not input to the memory area 404 from the logic circuit portion 402, when data is written to the memory area 404. When data is written to the memory area 404, signals from the external signal input portion 403 are blocked by the diode 406, and when data is read from the memory area 404, VDDH of the memory area 404 is fixed to VDD that is applied by the RF input portion 401, and stabilized. The diode 406 can be formed from a diode-connected thin film transistor. For example, an element to which a p-channel type thin film transistor is diode-connected can be used.

Also, the high potential side power supply (VDD) terminal of the RF input portion 401 and the VDDH terminal of the memory area 404 are connected via the diode 406. By connecting via the diode in this manner, short-circuiting of the VDDH terminal and a power supply connected to an end of the high potential side power supply (VDD) terminal when writing to the memory area is carried out can be prevented.

An antenna is connected to such a wireless chip via a pad, and the antenna and a resonance capacitor structure a resonance circuit. Then, signals and electrical power can be obtained by wireless communication via the antenna.

Further, for a signal transmission method of the foregoing wireless chip capable of data input/output without contact, an electromagnetic coupling method, an electromagnetic induction method, a microwave method, or the like can be used. The transmission method may be appropriately selected by the practitioner taking into consideration a purpose of use, and the most appropriate antenna may be provided according to the transmission method.

Then, voltage and signals input from the external signal input portion 403 are input to the memory area 404, and data (information) is written to the memory area 404. In the RF input portion 401, the data written receives AC signals from the antenna. The received signals and the data written to the memory area 404 are input to the logic circuit portion 402. The signals become control signals via the logic circuit portion 402, and by the control signals being input to the memory area 404, they are read again from the memory area 404.

In a structure of the wireless chip of the present invention, when data is written to the memory area 404, signals from the external signal input portion 403 are blocked by the diode 406, but when data is read from the memory area 404 by signals from the antenna, VDDH of the memory area 404 can be fixed to VDD of the RF input portion 401, and stabilized.

Figure 5B:
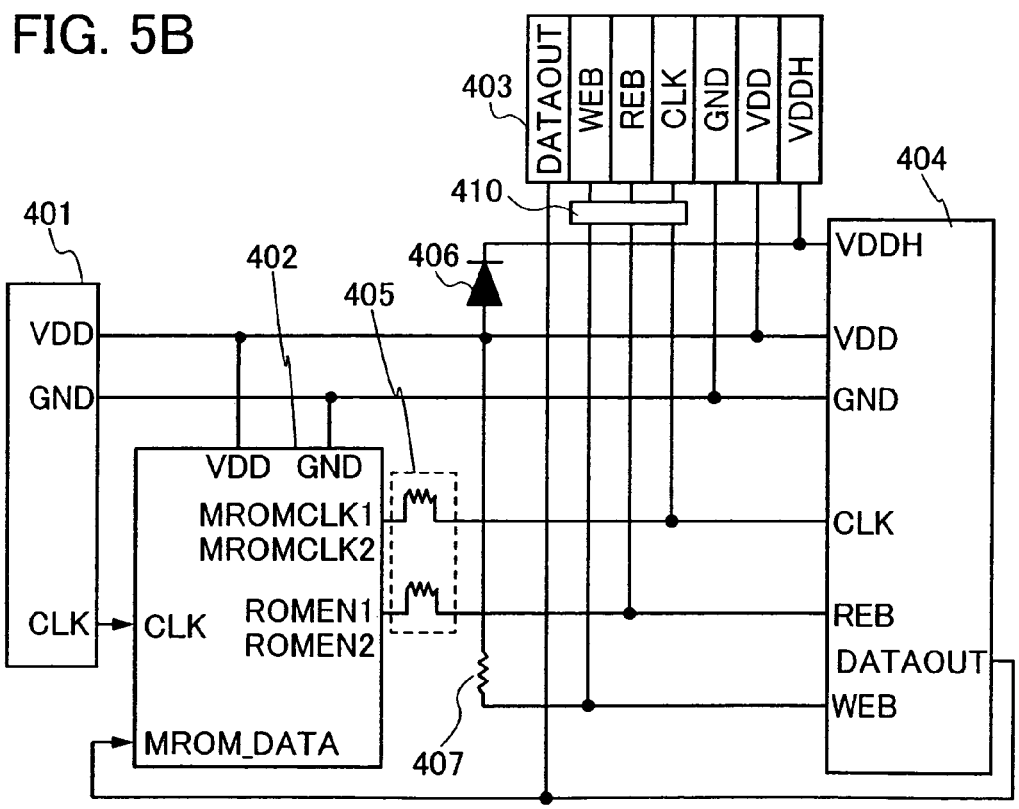

Also, as shown in FIG. 5B, a protective circuit 410 may be provided. The protective circuit 410 may be provided in a periphery of the external signal input portion 403, since static electricity occurs often in the external signal input portion. In this embodiment mode, the protective circuit 410 is provided between a WEB pad, a REB pad, and a CLK pad and a WEB terminal, a REB terminal, and a CLK terminal. The protective circuit 410 includes at least one thin film transistor between each of the pads (the WEB pad, the REB pad, and the CLK pad) and the corresponding terminal. It is preferable in that, as channel length of the thin film transistor increases, pressure resistance against static electricity or the like can be increased.

Of course, by creating a distance between the pad and the memory area of each the wireless chips shown in FIGS. 5A and 5B to be 500 μm or longer, preferably 750 μm or longer, or from 500 μm to 1 mm when expressed as a range, data writing can be carried out without being affected by stress or heat during pressure bonding of the antenna.

Embodiment Mode 5

In this embodiment mode, a structure of a wireless chip that is different from that of the foregoing embodiment mode and an operation thereof are described.

Figure 6A:
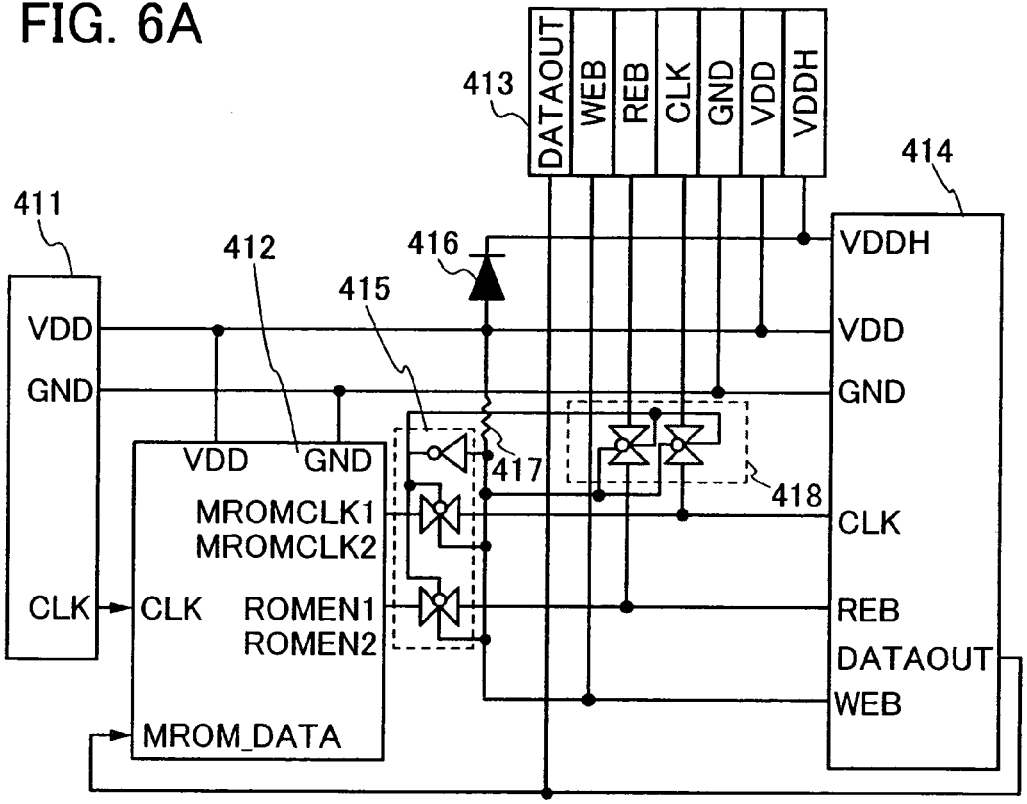
FIGS. 6A and 6B are each a circuit diagram showing a wireless chip of the present invention.

FIG. 6A shows a structure of a wireless chip in which a structure of the regulator circuit portion 405 is different from that of the wireless chip in FIG. 5A is shown. The wireless chip shown in FIG. 6A includes an RF input portion 411, a logic circuit portion 412, an external signal input portion 413, a memory area 414, a regulator circuit portion 415, a diode 416, a resistor 417, and a switching element 418. The regulator circuit portion 415 in the wireless chip of this embodiment mode is structured by a switch. As the switch, an inverter, an analog switch, or the like can be used. In this embodiment mode, an input terminal of the inverter and the analog switch are connected between the resistor 417 and a WEB terminal using the inverter or the analog switch, and the output terminal of the inverter and the analog switch are connected to each other.

Further, as the switching element 418, an inverter or an analog switch can be used. In this embodiment mode, an analog switch is provided between a reading signal input (REB) pad of the external signal input portion 413 and an REB terminal of the memory area 414, and an analog switch is provided between a CLK pad of the external signal input portion 413 and a CLK terminal of the memory area 414.

VDD is input to the WEB pad of the external signal input portion 413 when there is no external input to the WEB pad; however, the resistor 417 is set to prioritize an input of an external input when there is one. The regulator circuit portion 415 supplies stable signals to the memory area 414 by blocking unnecessary signals from the logic circuit portion 412 in a case where a Lo signal is input to the WEB pad by an external input, in other words in a case where external input is carried out, and blocking REB and CLK signals of external input in a case where a Hi signal is input to the WEB pad or in a case where there is no external input.

The wireless chip of this embodiment mode can also be operated in a similar manner to the foregoing embodiment mode. However, since the regulator circuit portion 415 including an inverter or an analog switch can be made to be used exclusively for power supply generation, it is preferable in that a problem where potential of VDDH decreasing by an amount of a threshold voltage of the diode 416 does not occur.

Figure 6B:
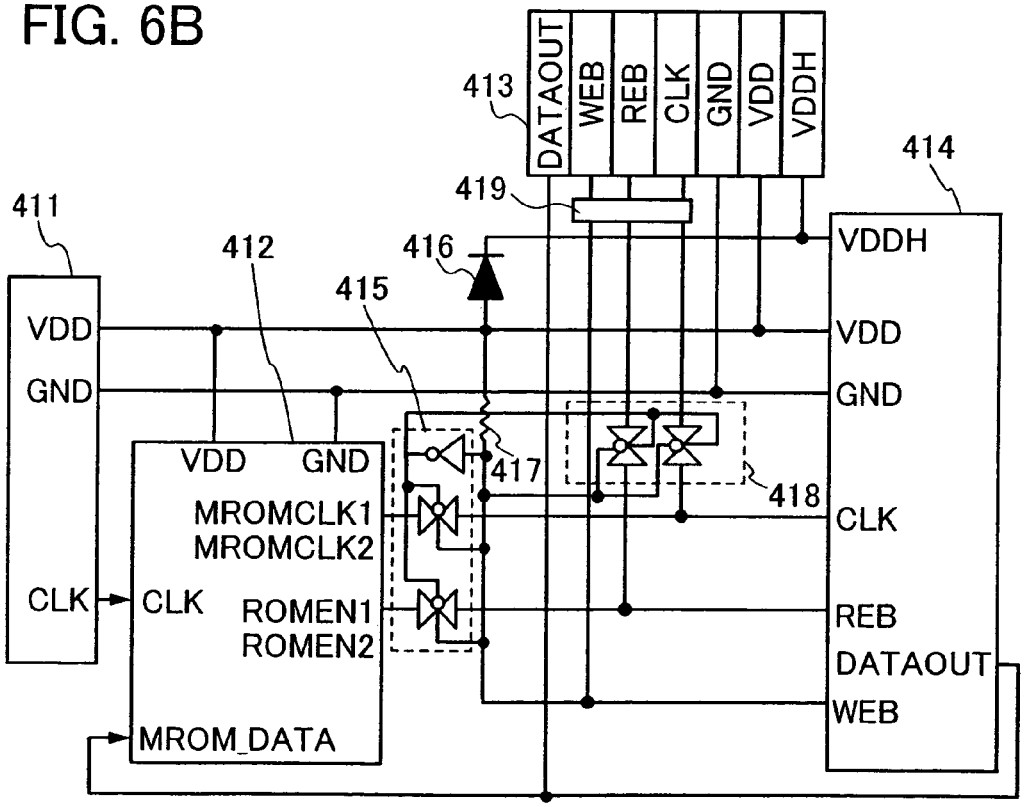

Also, as shown in FIG. 6B, a protective circuit 419 may be provided. The protective circuit 419 may be provided in a periphery of the external signal input portion 413, since static electricity occurs often in the external signal input portion. In this embodiment mode, the protective circuit 419 is provided between a WEB pad, a REB pad, and a CLK pad, and a WEB terminal, a REB terminal, and a CLK terminal. The protective circuit 419 includes at least one thin film transistor between each of the pads (the WEB pad, the REB pad, and the CLK pad) and the corresponding terminal. It is preferable that, as channel length of the thin film transistor increases, pressure resistance against static electricity or the like can be increased.

Of course, by creating a distance between the pad and the memory area of the wireless chip to be 500 μm or longer, preferably 750 μm or longer, or from 500 μm to 1 mm when expressed as a range, data writing can be carried out without being affected by stress or heat during pressure bonding of the antenna.

Embodiment Mode 6

In this embodiment mode, a structure of a memory (also called memory device) provided in a memory area and an operation thereof are described.

Figure 3:
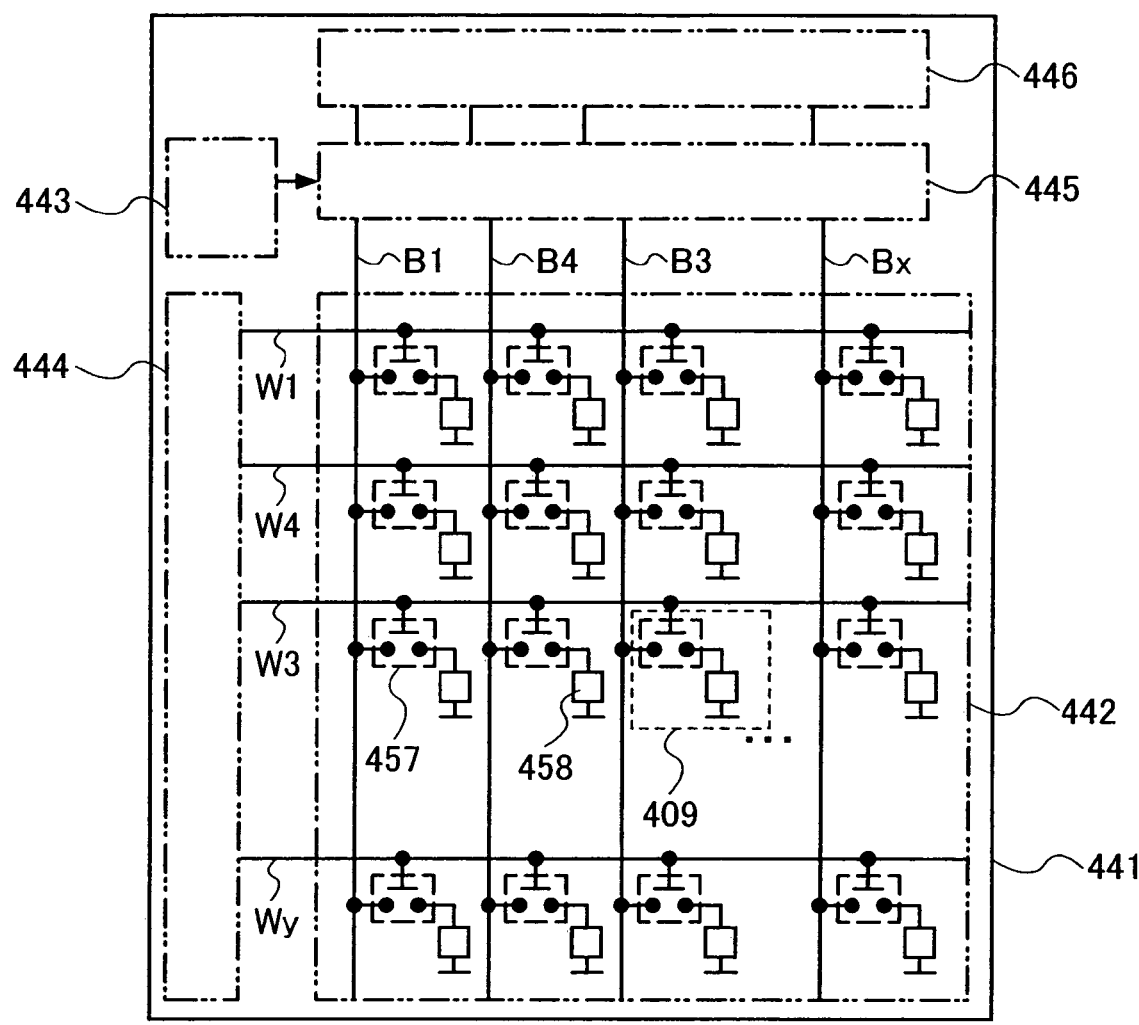
FIG. 3 is a circuit diagram showing a memory of the present invention.

FIG. 3 shows a structure of a memory. A memory of the present invention includes a memory cell array 442 in which memory cells 409 are arranged in a matrix form; decoders 443 and 444; a selector 445; and a reading/writing circuit 446. Each of the memory cells 409 includes a memory element 458 and a switching element 457, and is referred to as an active type memory. As another structure of a memory, there is a passive type memory in which a switching element is not provided. The present invention can also be applied to the passive type memory.

Each of the memory cells 409 is provided in a crossing region of a bit line Bx (1≦x≦m) and a word line Wy (1≦y≦n). Further, the memory element has a structure that includes an organic compound layer between a first conductive layer structuring the bit line and a second conductive layer structuring the word line.

A gate electrode of the switching element 457 is connected to the word line Wy (1≦y≦n), one of a source electrode and a drain electrode is connected to the bit line Bx (1≦x≦m), and the other of the source electrode and the drain electrode is connected to one electrode of the memory element 458.

With respect to such a memory element, writing or reading can be carried out by an electrical or an optical effect. In a case of carrying out writing or reading by an optical effect, it is necessary that one or both of the first conductive layer and the second conductive layer have a light transmitting property. The conductive layer having a light transmitting property is formed using a transparent conductive material such as indium tin oxide (ITO), or formed using a material that is not a transparent conductive material with a thickness that transmits light.

Subsequently, an operation when data is written by an electrical effect is described. In this case, first, a single memory cell 409 is selected by the decoders 443 and 444 and the selector 445. Subsequently, data is written to the memory cell 409 by the reading/writing circuit 446. Specifically, a prescribed voltage is applied to the memory element 458 included in the selected memory cell 409 so that a large current flows, and to cause a short circuit between a pair of conductive layers of the memory element 458. The memory element that is short-circuited has a significantly smaller resistance value compared to another memory element 458. In this manner, by applying an electrical effect, data writing is carried out by utilizing a change in the resistance value of the memory element 458. For example, in a case where the memory element 458 to which an electrical effect is not applied has data "0," when writing data "1," voltage is applied to the selected memory element 458 so that a large current flows, to cause a short circuit. A state of the short circuit can be controlled by a glass transition temperature of the organic compound layer. In other words, if the glass transition temperature is a low temperature, the short circuit can be easily caused by feeding a current.

Subsequently, an operation when data reading is carried out is described. In this embodiment mode, a case of the reading/writing circuit 446 having a structure including a resistor element and a sense amplifier is described. However, the structure of the reading/writing circuit 446 is not restricted to the foregoing structure, and may have any kind of structure.

Data reading is carried out by applying a voltage between the first conductive layer and the second conductive layer of the memory element 458, and reading a resistance value of the memory element 458. For example, in a case where data writing is carried out by applying an electrical effect, a resistance value of the memory element 458 to which an electrical effect is not applied is different from a resistance value of the memory element 458 to which an electrical effect is applied. Data reading can be carried out by electrically reading such a difference in resistance values.

FIG. 4 shows a structural example of one of the memory cells 409.

As shown in FIG. 4, each of the memory cells 409 includes the switching element 457 and the memory element 458. A thin film transistor can be applied to the switching element 457. When a thin film transistor is used, it is preferable in that circuits such as the decoders and the selector and the switching element can be formed at the same time.

The memory element 458 includes the first conductive layer, the organic compound layer, and the second conductive layer. The second conducive layer can be shared by the memory cells in the memory cell array 442. This is referred to as a common electrode 449. The common electrode provides a common potential to all of the memory cells during reading and writing of the memory device.

The memory device having the foregoing structure can be used as a volatile memory, typically, as a DRAM (Dynamic Random Access Memory).

A pad is provided so that a distance between the pad and such a memory area, specifically, a region in which the memory element is formed, is 500 μm or longer, preferably 750 μm or longer, or from 500 μm to 1 mm when expressed as a range. Since the memory includes the organic compound layer, it is particularly easy to be significantly affected by stress or heat during pressure bonding of an antenna; however, by having a prescribed distance, data writing can be carried out without being affected by stress or heat of pressure bonding of the antenna.

Embodiment Mode 7

In this embodiment mode, a manufacturing method of a wireless whip is described.

Figure 7A:
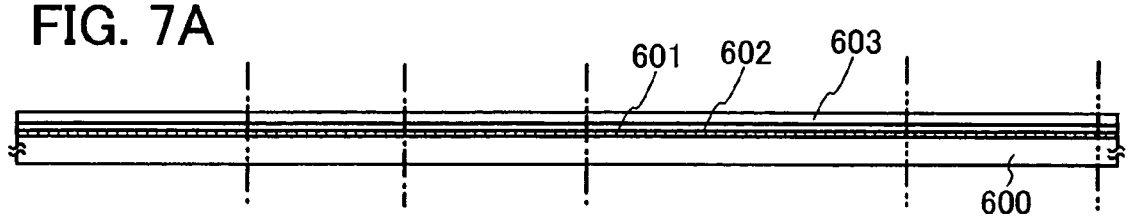
FIGS. 7A to 7D are each a cross-sectional view showing a manufacturing step of a wireless chip of the present invention.

In FIG. 7A, a peeling layer 601, an insulating layer 602, and a semiconductor film 603 are formed in this order over a substrate 600 having an insulating surface (hereinafter referred to as insulating substrate). As the insulating substrate

600, a glass substrate, a quartz substrate, a substrate made from silicon, a metal substrate, a plastic substrate, or the like can be used. Also, the insulating substrate 600 may be reduced in thickness by polishing. By using the insulating substrate that is reduced in thickness, a completed product can be reduced in weight and in thickness.

The peeling layer 601 can be formed using an element selected from W, Ti, Ta, Mo, Nb, Nd, Ni, Co, Zr, Zn, Ru, Rh, Pd, Os, Ir, and Si; or an alloy material or a compound material mainly containing the element. The peeling layer can have a single layer structure of the element or the like, or a stacked layer structure of the element and the like. Such a peeling layer can be formed by a CVD method, a sputtering method, an electron beam, or the like. In this embodiment mode, W is formed by a CVD method. At this time, a plasma treatment may be carried out using $O_2$, $N_2$, or $N_2O$. Then, a peeling step which is a later step can be carried out easily. The peeling layer 601 can have a single layer structure or a stacked layer structure. Also, the peeling layer 601 is not necessary to be formed over the entire insulating substrate, and may be selectively formed. In other words, it is acceptable as long as the peeling layer 601 allows the insulating substrate 600 to peel off later, and a region in which the peeling layer is formed is not limited.

For the insulating layer 602, an inorganic material such as silicon oxide, silicon nitride, or the like can be used, and the insulating layer 602 can have a single layer structure or a stacked layer structure. By using silicon nitride, entry of an impurity element from the insulating substrate can be prevented. In a case of a stacked layer structure, such silicon oxide is effective by being included in one of the layers.

For the semiconductor film 603, a material including silicon can be used. The semiconductor film can be formed using a CVD method or a sputtering method. A crystal structure of the semiconductor film 603 may be any of amorphous, crystalline, and microcrystalline. The higher the crystallinity is, the higher a mobility of a thin film transistor can be made, which is preferable. Also, with a microcrystalline or amorphous crystal structure, there is no variance in crystal state between adjacent semiconductor films, which is preferable.

In forming a crystalline semiconductor film, there is a case where the crystalline semiconductor film is directly formed over the insulating film 602; however, it is manufactured by heating an amorphous semiconductor film formed over the insulating layer 602. For example, the amorphous semiconductor film is heated using a heating furnace or by laser irradiation. As a result, a semiconductor film with high crystallinity can be formed. At this time, in order to lower a heating temperature, a metal element which promotes crystallization may be used. For example, by adding nickel (Ni) to a surface of the amorphous semiconductor film and carrying out a heating treatment, temperature can be lowered. As a result, a crystalline semiconductor film can be formed over an insulating substrate having low heat resistance. Note that in a case of using laser irradiation, since a semiconductor film is heated selectively, heating temperature is not restricted by heat resistance of an insulating substrate that is used.

Figure 7B:
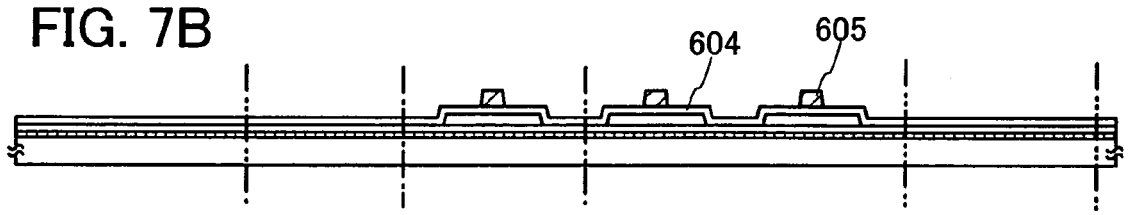

As shown in FIG. 7B, the semiconductor film 603 is processed so as to have a prescribed shape. For the process, etching using a mask formed by a photolithography method can be used. A dry etching method or a wet etching method can be used for the etching.

An insulating layer functioning as a gate insulating film 604 is formed so as to cover the processed semiconductor film. The gate insulating film 604 can be formed using an inorganic material; for example, it can be formed using silicon nitride or silicon oxide. A plasma treatment may be carried out before or after forming the gate insulating film 604. For the plasma treatment, oxygen plasma or hydrogen plasma can be used. By such a plasma treatment, an impurity can be removed from a gate insulating film formation surface or a gate insulating film surface.

Subsequently, a conductive layer functioning as a gate electrode 605 is formed over the semiconductor film with the gate insulating film 604 interposed therebetween. The gate electrode 605 can have a single layer structure or a stacked layer structure. For the gate electrode 605, an element selected from titanium (Ti), tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), platinum (Pt), aluminum (Al), gold (Au), silver (Ag), copper (Cu), and indium (In); or an alloy material or a compound material mainly containing the element can be used.

Figure 7C:
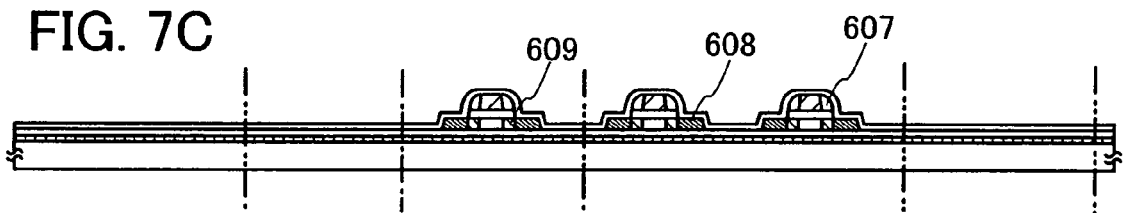

As shown in FIG. 7C, an insulator functioning as a sidewall 607 is formed over a side surface of the gate electrode 605. The sidewall 607 can be formed using an inorganic material or an organic material. As the inorganic material, silicon oxide and silicon nitride are given. For example, by forming silicon oxide so as to cover the gate electrode 605 and then carrying out isotropic etching, silicon oxide remains only over the side surface of the gate electrode 605, and this can be used as the sidewall. For the isotropic etching, a dry etching method or a wet etching method can be used. When the sidewall 607 is processed, the gate insulating film 604 is also etched away. As a result, a portion of the semiconductor film is exposed.

Using the sidewall 607 and the gate electrode 605, an impurity element is added to the semiconductor film in a self-aligning manner. As a result, impurity regions having different concentrations are formed in the semiconductor film. An impurity region 609 provided under the sidewall 607 has a lower concentration compared to an impurity region 608 formed in the exposed semiconductor film. In this manner, by the impurity regions having different concentrations, a short channel effect can be prevented.

Figure 7D:
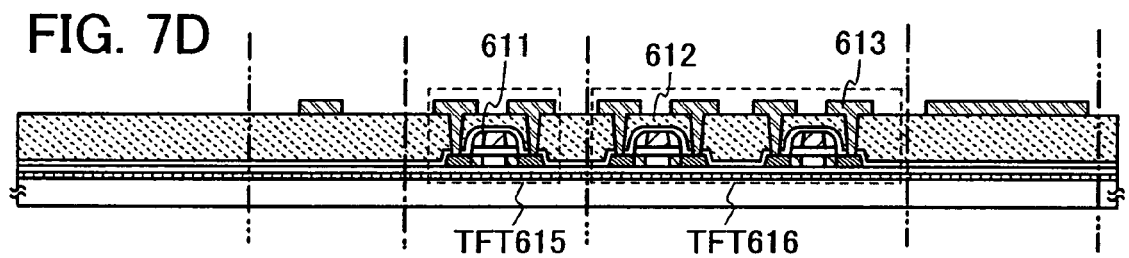

As shown in FIG. 7D, insulating layers 611 and 612 are formed covering the semiconductor film, the gate electrode, and the like. The insulating layer covering the semiconductor film, the gate electrode, and the like may have a single layer structure, but it is preferable to have a stacked layer structure as in this embodiment mode. This is because by forming the insulating layer 611 using an inorganic material, entry of an impurity can be prevented. Further, by applying an inorganic material using a CVD method, a dangling bond in the semiconductor film can be terminated using hydrogen in the insulating layer 611. Subsequently, by forming the insulating layer 612 using an organic material, flatness can be improved. As the organic material, polyimide, acrylic, polyamide, polyimide amide, a resist, benzocyclobutene, siloxane, or polysilazane can be used. Note that a skeletal structure of siloxane is structured by a bond between silicon (Si) and oxygen (O). For a substituent, an organic group including at least hydrogen (for example, an alkyl group or an aromatic hydrocarbon) is used. A fluoro group may be used as the substituent. Alternatively, for the substituent, the organic group including at least hydrogen and the fluoro group may be used. Polysilazane is formed with a polymer material having a bond between silicon (Si) and nitrogen (N) as a starting material.

Subsequently, a wire 613 that penetrates through the insulating layers 611 and 612 and connects with the impurity region 608 is formed. The wire 613 can have a single layer structure or a stacked layer structure, and can be formed using an element selected from titanium (Ti), tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), platinum (Pt), aluminum (Al), gold (Au), silver (Ag), copper (Cu), and indium (In); or an alloy material mainly containing the element. While forming the wire 613, another wire can be formed over the insulating layer 612. The other wire corresponds to a leading wire or the like.

In this manner, a thin film transistor (TFT) 615 and a TFT group 616 can be formed. The TFT group refers to a group of TFTs structuring a circuit having a specific function.

Figure 8A:
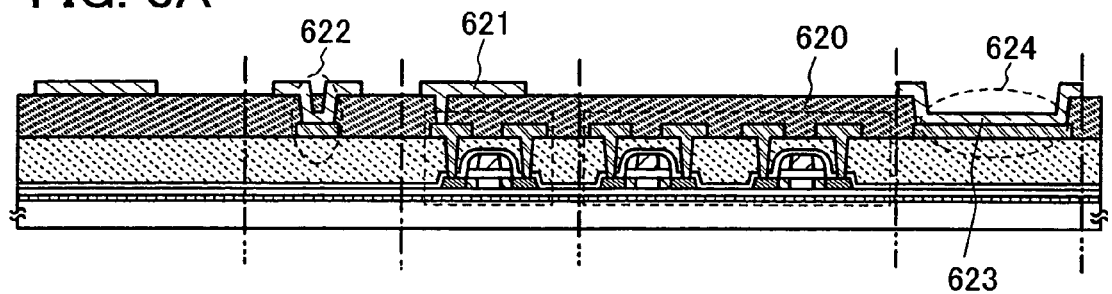
FIGS. 8A to 8C are each a cross-sectional view showing a manufacturing step of a wireless chip of the present invention.

As shown in FIG. 8A, an insulating layer 620 is formed over the insulating layer 612. The insulating layer 620 can be formed using an inorganic material or an organic material in a similar manner to forming the insulating layer 611 and 612. A wire 621 is formed so as to penetrate the insulating layer 620. The wire 621 can be formed in a similar manner to the wire 613. The wire 621 is electrically connected to the wire 613 in a region 622 via an open portion provided in the insulating layer 620. In the region 622, a common electrode of a memory element formed later can be grounded. Also, a pad 623 is formed from the same layer as the wire 621. The pad 623 is electrically connected to a wire in a region 624 via an open portion provided in the insulating layer 620.

Figure 8B:
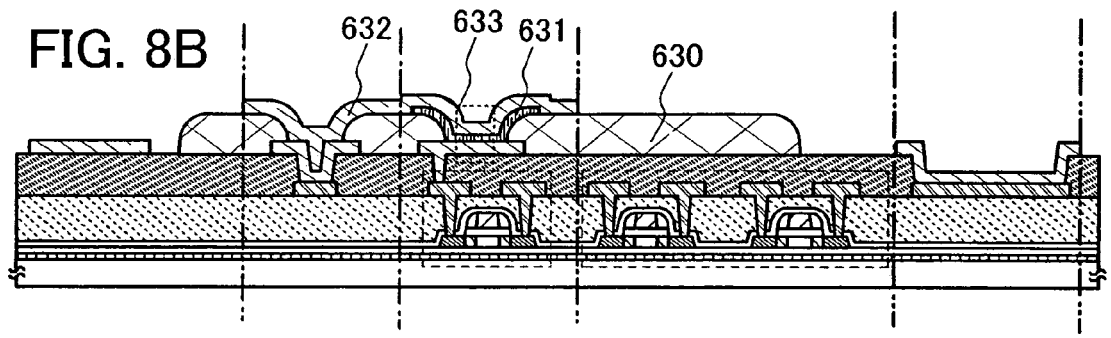

As shown in FIG. 8B, an insulating layer 630 is formed over the insulating layer 620. The insulating layer 630 can be formed using an inorganic material or an organic material in a similar manner to forming the insulating layers 611 and 612. An open portion is provided in the insulating layer 630. The insulating layer 630 is processed so that a side surface of the open portion is slanted.

An organic compound layer 631 is formed in the open portion provided over the TFT 615. The organic compound layer 631 can be formed by an evaporation method or a sputtering method. Such an organic compound layer can be formed from a known electroluminescent material. Subsequently, a wire 632 is formed covering a portion of the organic compound layer 631 and the insulating layer 630. The wire 632 can be formed in a similar manner to the wire 621. A region in which the wire 632 is formed becomes a memory area and a contact region. The wire 632 becomes a common electrode of a memory element.

Figure 8C:
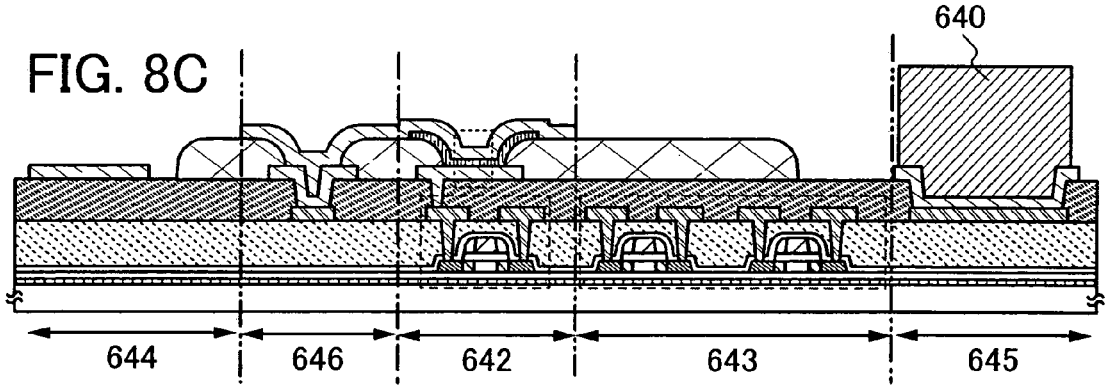

As shown in FIG. 8C, an antenna 640 is formed. At this time, the antenna 640 is pressure-bonded to the pad 623 to be electrically connected. In this manner, a wireless chip including a wiring region 644 in which a leading wire and the like are formed; a memory area 642 in which a memory element is formed; an integrated circuit region 643 including a TFT group and in which a circuit having a specific function is formed; a pad region 645; and a contact region 646 is formed so that a distance between the pad and such a memory area is 500 µm or longer, preferably 750 µm or longer, or from 500 µm to 1 mm when expressed as a range. Also, the pad region and the memory area are provided with a certain distance therebetween. As a result, data writing can be carried out without being affected by stress or heat during pressure bonding of the antenna.

Pressure bonding of the antenna may be carried in a state where flexibility of the insulating substrate is low. Therefore, in this embodiment mode, a mode where the thin film transistor is transposed to a film substrate after pressure bonding of the antenna is shown.

Figure 9A:
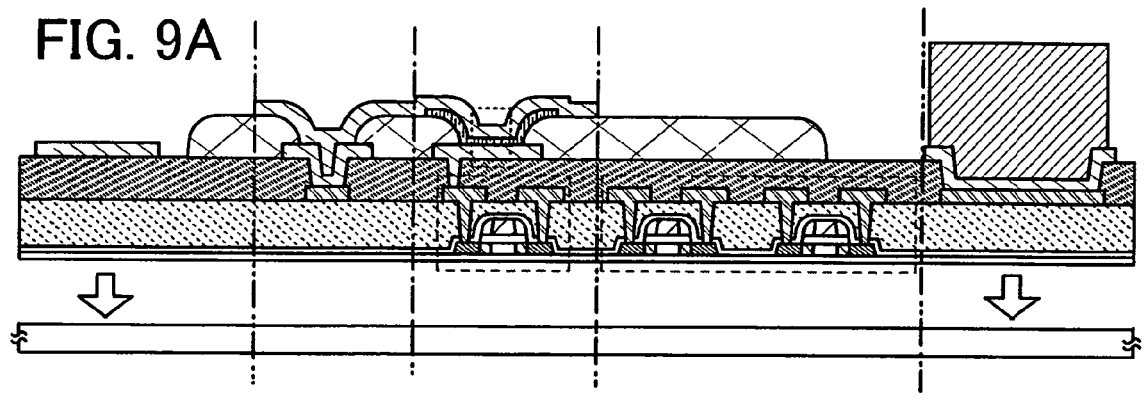
FIGS. 9A and 9B are each a cross-sectional veiw showing a manufacturing step of a wireless chip of the present invention.

As shown in FIG. 9A, by removing the peeling layer 601, the insulating substrate 600 is peeled. The peeling layer 601 is removed chemically or by applying physical force to the insulating substrate 600. For example, by a carrying out a heating treatment or the like on the semiconductor film, a crystal structure of the peeling layer 601 can also be changed. Subsequently, an open portion is provided so that a portion of the peeling layer 601 is exposed, and the exposed peeling layer 601 is irradiated with laser light. By irradiating the peeling layer 601 with laser light, a trigger for peeling can be provided. Then, the thin film transistor or the like can be physically peeled from the insulating substrate, and furthermore, the thin film transistor or the like may peel off naturally from the insulating substrate by stress of the film, without particularly applying force. Alternatively, the peeling layer 601 can be removed by utilizing a chemical reaction by forming an open portion reaching the peeling layer 601, and introducing an etching agent via the open portion.

Figure 9B:
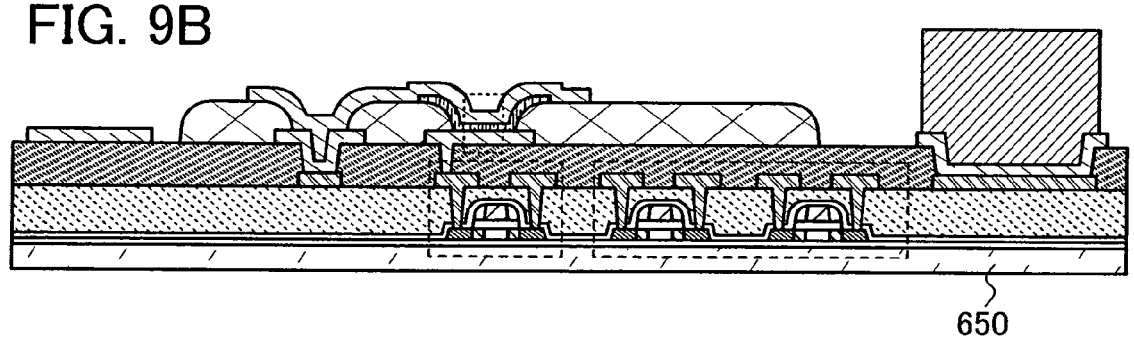

Subsequently, as shown in FIG. 9B, a film substrate 650 is attached. In a case where a surface of the film substrate 650 has an adhesive property, it can be attached as it is. In a case without an adhesive property, the film substrate 650 can be attached via an adhesive agent.

In this manner, a wireless chip in which the thin film transistor or the like is transposed to the film substrate can be formed. Such a wireless chip has added values such as achieving reduction in weight and in thickness as well as high flexibility, in addition to an organic memory area being formed over the same substrate.

Embodiment Mode 8

In this embodiment mode, a manufacturing method of a wireless chip formed over a glass substrate, unlike the foregoing embodiment mode, is described.

In the foregoing embodiment mode, the manufacturing method of a wireless chip in which the peeling layer 601 is formed, and then peeled to transpose the thin film transistor to the film substrate is described. However, a wireless chip of the present invention can be directly formed over a glass substrate.

A silicon nitride film may be formed as a protective film over the uppermost layer of a wireless chip formed over a glass substrate.

Also, when reduction in thickness is desired, the glass substrate can be polished. For example, a side of the glass substrate over which a thin film transistor is not formed is polished by a CMP method or the like. As a result, in the wireless chip, reduction in thickness of the glass substrate which is the thickest out of the layers structuring the wireless chip can be achieved, and thickness of the wireless chip as a whole can be reduced.

A reason that the wireless chip can be manufactured over the glass substrate in this manner is because a temperature of a process is lowered, or because heating of the glass is prevented, which is achieved by using a metal element in a manufacturing step of a crystalline semiconductor film included in the thin film transistor, or by using laser irradiation.

Embodiment Mode 9

In this embodiment mode, a structure of a wireless chip including a coil-shaped antenna, unlike the foregoing embodiment mode, is described.

Figure 10A:
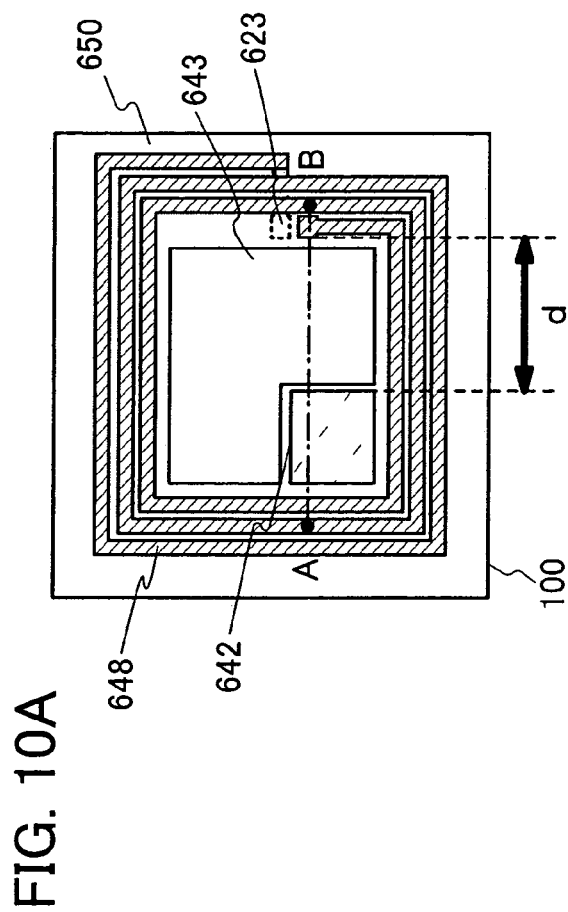
FIGS. 10A and 10B are a top view and a cross-sectional view, respectively, showing a wireless chip of the present invention.

In FIG. 10A, a top view of the wireless chip including a coil-shaped antenna is shown. The wireless chip 100 includes the memory area 642 and the integrated circuit region 643 in a central portion of the film substrate 650, and a coil-shaped antenna 647 is provided so as to surround these. The coil-shaped antenna is an antenna that is provided in a rectangular shape, and has 4 or more corners. Also, such an antenna is in a state in which it is coiled so that a diameter increases from the center towards the exterior.

Further, at an end of the antenna 647, the pad 623 for connecting to the integrated circuit region 643 is provided. Also, a distance d between the pad 623 and the memory area 642 is 500 μm or longer, preferably 750 μm or longer, or from 500 μm to 1 mm when expressed as a range. As a result, data writing can be carried out without being affected by stress or heat during pressure bonding of the antenna.

In this embodiment mode, the manufacturing method of the foregoing embodiment mode can be referred to, and the wireless chip can be formed by for example transposing the thin film transistor from the insulating substrate to the film substrate 650.

Figure 10B:
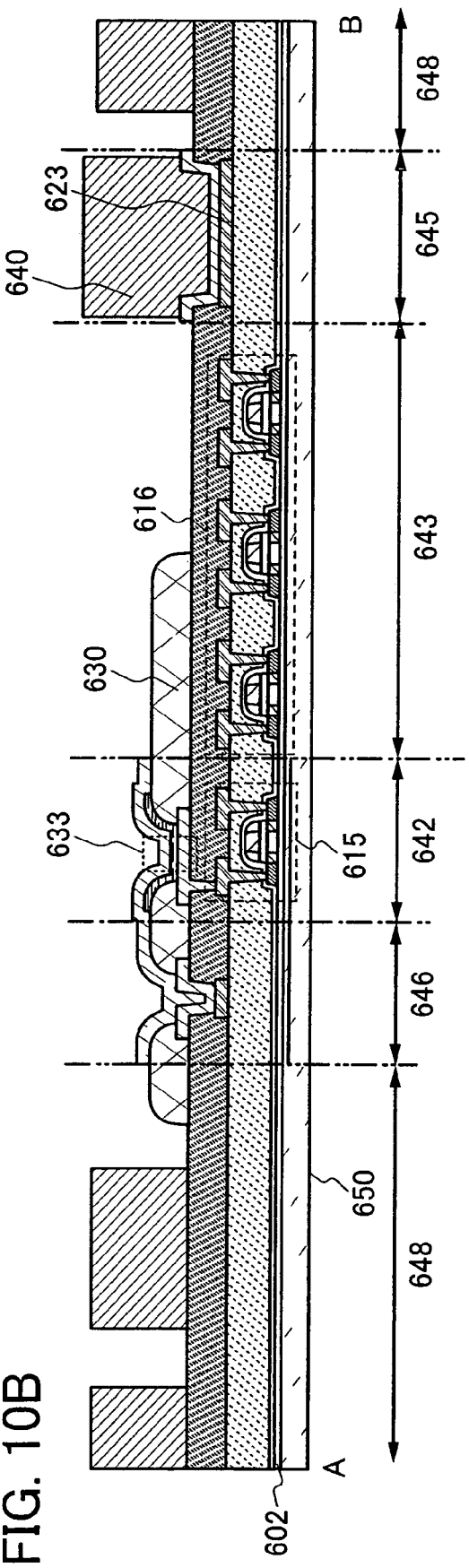

FIG. 10B shows a cross-sectional view of such a wireless chip along a line A-B. In the cross-sectional view along the line A-B, the wireless chip includes on each side an antenna region 648 in which an antenna is provided, and from one of the antenna regions 648, the contact region 646, the memory area 642, the integrated circuit region 643, and the pad region 645 are provided in this order.

Over the film substrate 650, the TFT 615, the TFT group 616, and the like are provided with the insulating layer 602 interposed therebetween in a similar manner to the foregoing embodiment mode. A memory element 633 is formed over the TFT 615, and the insulating layer 630 that segments the memory element 633 is provided over the memory area 642 and the integrated circuit region 643.

An open portion is provided in the insulating layer, the pad 623 is formed, and the antenna 640 is provided so as to be pressure-bonded to the pad. At this time, a distance between the memory area and the pad is 500 μm or longer, preferably 750 μm or longer, or from 500 μm to 1 mm when expressed as a range. As a result, data writing can be carried out without being affected by stress or heat during pressure bonding of the coil-shaped antenna.

Embodiment Mode 10

In this embodiment mode, a wireless chip including a transistor formed using LSI unlike the foregoing embodiment mode which has a structure including a coil-shaped antenna, is described.

Figure 18A:
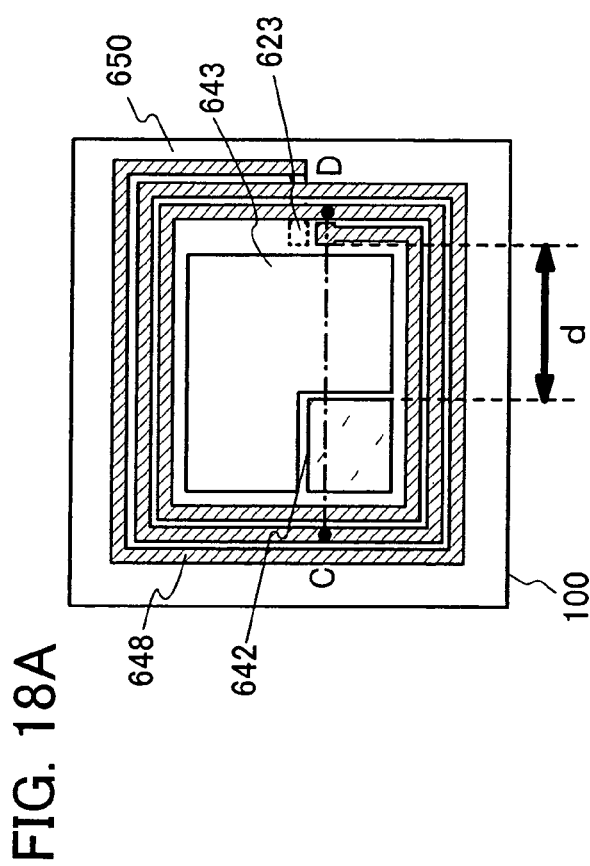
FIGS. 18A and 18B are a top view and a cross-sectional view, respectively, showing a wireless chip of the present invention.

In FIG. 18A, a top view of a wireless chip is shown. The wireless chip includes a coil-shaped antenna in a similar manner to the foregoing embodiment mode, and a distance d between the pad 623 and a memory area 642 is 500 μm or longer, preferably 750 μm or longer, or from 500 μm to 1 mm when expressed as a range. As a result, data writing can be carried out without being affected by stress or heat during pressure bonding of the antenna.

Figure 18B:
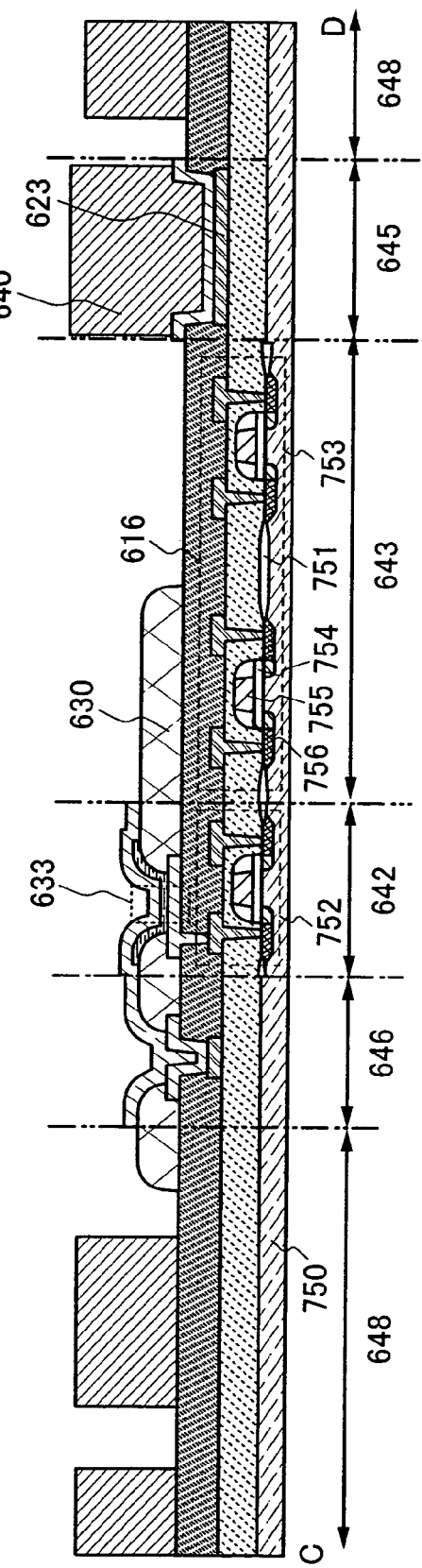

In FIG. 18B, a cross-sectional view of such a wireless chip along a line C-D is shown. In the cross-sectional view along the line C-D, in a similar manner to the foregoing embodiment mode, the wireless chip includes on each side an antenna region 648 in which an antenna is provided, and from one of the antenna regions 648, the contact region 646, the memory area 642, the integrated circuit region 643, and the pad region 645 are provided in this order. A point that is unlike the forgoing embodiment mode is that transistors 752 and 753 formed over a silicon substrate 750 are included. For the wireless chip using the silicon substrate, it is also necessary that the antenna is attached without an effect of stress or heat during pressure bonding of the antenna.

In order to form the transistors 752 and 753, an oxide layer 751 for element isolation is formed over the silicon substrate 750 using LSI technology. The oxide layer 751 is selectively formed by a thermal oxidation method. Subsequently, a gate insulating layer 754 is formed, and a gate electrode 755 is formed over the insulating layer. On each side of the gate electrode 755, an insulating layer 756 functioning as a sidewall is formed. In this state, using the gate electrode 755 and the insulating layer 756, the gate insulating layer 754 is etched away. Subsequently, an impurity element is added, and the transistors 752 and 753 are formed.

Further, in order to reduce a thickness of the silicon substrate 750, a side over which a transistor is not formed may be polished.

A wireless chip of the present invention can be formed using such a transistor using LSI technology. The transistor using LSI technology has a high electrical property; therefore, it is favorably applied to a switching element or the like of the integrated circuit region 643.

Embodiment Mode 11

In this embodiment mode, a mode of a wireless chip in which the memory area 642 and the integrated circuit region 643 are provided outside of the coil-shaped antenna, unlike the foregoing embodiment mode, is described.

Figure 19:
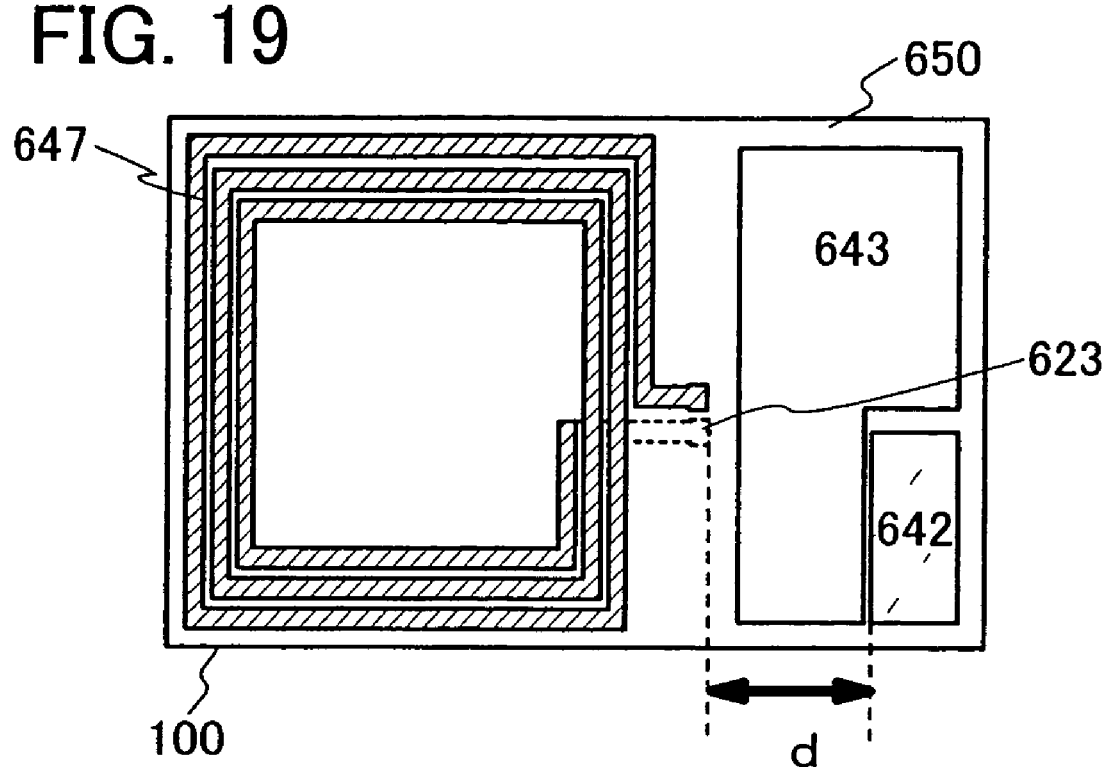
FIG. 19 is a top view showing a wireless chip of the present invention.

As shown in FIG. 19, the memory area 642 and the integrated circuit region 643 are provided outside and to the right of the coil-shaped antenna 647. Other components are similar to that of the foregoing embodiment mode; therefore, descriptions thereof are omitted. In the wireless chip of such a mode also, a distance d between the pad 623 and the memory area 642 is 500 μm or longer, preferably 750 μm or longer, or from 500 μm to 1 mm when expressed as a range. As a result, data writing can be carried out without being affected by stress or heat during pressure bonding of the coil-shaped antenna.

This embodiment mode can be freely combined with the foregoing embodiment mode.

Embodiment Mode 12

In this embodiment mode, a shape of an antenna formed over an antenna substrate is described.

As a transmission method of signals for a wireless chip, an electromagnetic coupling method or an electromagnetic induction method (for example, 13.56 MHz band) can be applied. When an electromagnetic induction method is used, since electromagnetic induction caused by change in magnetic field density is utilized, a conductive layer functioning as an antenna is formed in a annular shape (for example, a loop antenna) or in a spiral shape (for example, a spiral antenna).

Further, as a transmission method of signals for a wireless chip, when a microwave method (for example, UHF band (860 to 960 MHz band), 2.45 GHz band, or the like) is applied, a shape of the conductive layer functioning as an antenna such as length is decided by taking into consideration a wavelength of an electromagnetic wave used in the transmission of signals. For example, the conductive layer functioning as an antenna can be formed in a linear shape (for example, a dipole antenna), a flat shape (for example, a patch antenna), a ribbon shape, or the like. Also, the shape of the conductive layer functioning as an antenna is not limited to the linear shape, and the conductive layer may be provided in a curved line shape, a serpentine shape, or a combination thereof, taking into consideration the wavelength of the electromagnetic wave.

Figure 12A:
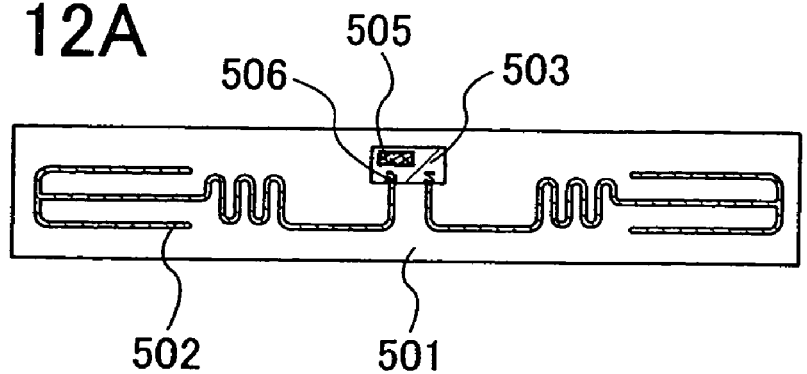
FIGS. 12A to 12C are each a top view showing an antenna mounted to a wireless chip of the present invention.

FIG. 12A shows an example in which the conductive film functioning as an antenna is formed so as to have a line shape with a narrow width, and so as to be rectangular. In FIG. 12A, to an antenna substrate 501 over which a conductive layer 502 functioning as an antenna (having a dipole antenna shape) is formed, an integrated circuit 503 including a memory area 505 and the like is attached. A dipole antenna is an antenna in which two antenna elements are arranged in a linear shape, and is an antenna pattern which has a gain in a donut shape in a direction that crosses with an antenna line. As for directivity, the dipole antenna is strongly omnidirectional, and communication range in terms of angle is wide. If a communication frequency of a high frequency band or an ultra high frequency band of 300 kHz to 30 MHz is used, a communication distance of several centimeters to several tens of centimeters can be secured. Also, if a communication frequency of a microwave band (typically 2.45 GHz) is used, a communication distance of several meters can be secured. The antenna is electrically connected to the integrated circuit 503 via a pad 506 that is provided away from the memory area 505 with a distance of 500 μm or longer, preferably 750 μm or longer, or from 500 μm to 1 mm when expressed as a range.

Figure 12B:
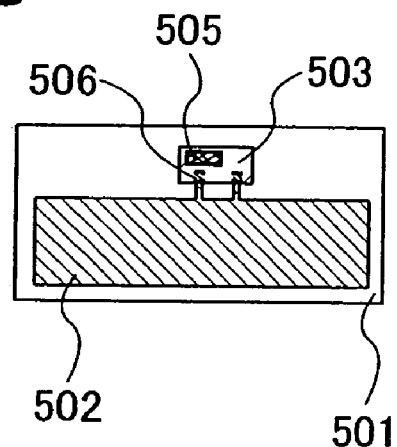

FIG. 12B shows an example of a monopole or a dipole antenna, of which the conductive layer functioning as an antenna is formed to have a linear shape with a wide width, in other words has a linear shape. This antenna shape is appropriately set taking into consideration directivity or impedance of the antenna. In FIG. 12B, to the antenna substrate 501 over which the conductive layer 502 functioning as an antenna (having a patch antenna shape) is formed, the integrated circuit 503 including the memory area 505 and the like is attached. A patch antenna has extremely high directivity, and depending on an antenna shape, directivity in one direction can be improved. As a frequency band, a UHF band of 900 to 980 MHz, a microwave band of 2.45 GHz or the like can be used. The antenna is electrically connected to the integrated circuit 503 via the pad 506 that is provided away from the memory area 505 with a distance of 500 μm or longer, preferably 750 μm or longer, or from 500 μm to 1 mm when expressed as a range.

Figure 12C:
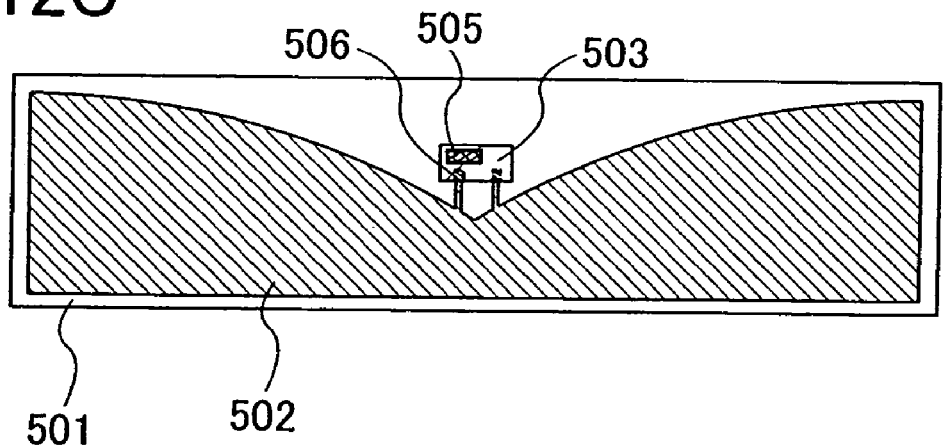

FIG. 12C shows an example of forming the conductive layer functioning as an antenna in a ribbon shape (also referred to as a fan shape). This is a type of a monopole or dipole antenna, which can be applied to communication using a high frequency band such as 13.56 MHz, a UHF band of 950 to 956 MHz or the like, and microwave band typified by 2.45 GHz, in a similar manner to another antenna. In FIG. 12C, to the antenna substrate 501 over which the conductive layer 502 functioning as an antenna is formed, the integrated circuit 503 including the memory area 505 and the like is attached. The antenna is electrically connected to the integrated circuit 503 via the pad 506 that is provided away from the memory area 505 with a distance of 500 μm or longer, preferably 750 μm or longer, or from 500 μm to 1 mm when expressed as a range.

The conductive layer functioning as an antenna is formed from a conductive material over the antenna substrate by a CVD method; a sputtering method; a printing method such as screen printing or gravure printing; a droplet discharging method; a dispenser method; a plating method, or the like. The conductive material is an element selected from aluminum (Al), titanium (Ti), silver (Ag), copper (Cu), gold (Au), platinum (Pt), nickel (Ni), palladium (Pd), tantalum (Ta), molybdenum (Mo), and indium (In); or an alloy material or a compound material mainly containing the element. The conductive layer functioning as an antenna is formed as a single layer structure or a stacked layer structure.

For example, in a case of forming the conductive layer functioning as an antenna using a screen printing method, the conductive layer functioning as an antenna can be provided by selectively printing a conductive paste in which conductor particles each with a grain diameter of several nm to several tens of μm are dissolved or dispersed in an organic resin. As the conductor particles, one or more types of metal particles of silver (Ag), gold (Au), copper (Cu), nickel (Ni), platinum (Pt), palladium (Pd), tantalum (Ta), molybdenum (Mo), titanium (Ti) and the like; fine particles of silver halide; or dispersed nanoparticles can be used. Also, as the organic resin included in the conductive paste, one or a plurality selected from organic resins functioning as a binder, a solvent, a dispersant, or a coating material of metal particles can be used. Typically, organic resins such as an epoxy resin and a silicon resin are given. Also, in forming the conductive layer, it is preferable that the conductive paste is pushed out and then baked. For example, in a case of using fine particles mainly containing silver (for example, grain diameter of 1 nm to 100 nm) as a material of the conductive paste, the conductive layer can be obtained by baking the paste in a temperature range of 150 to 300° C. so that it is cured. Also, fine particles mainly containing solder or lead-free solder may be used, an in this case, fine particles each with a grain diameter of 20 μm or less are preferably used. Solder and lead-free solder have an advantage of being low in cost.

Also, other than the materials mentioned above, ceramic, ferrite, or the like may be applied to the antenna.

Also, in a case of applying an electromagnetic coupling method or an electromagnetic induction method, and when a wireless chip including an antenna is provided to be in contact with a metal, a magnetic material with magnetic permeability is preferably provided between the semiconductor device and the metal. This is because an eddy current flows through the metal accompanying a change in a magnetic field, and a demagnetizing field generated by the eddy current impairs a change in the magnetic filed and shortens communication distance. Therefore, by providing the material with magnetic permeability between the wireless chip and the metal, the eddy current of the metal can be suppressed, as well as the shortening of the communication distance. Note that as the magnetic material, a metal thin film or ferrite having high magnetic permeability and little loss of high frequency can be used.

In this manner, by positioning the pad which electrically connects the antenna formed over the antenna substrate away from the memory area with a distance of 500 μm or longer, preferably 750 μm or longer, or from 500 μm to 1 mm when expressed as a range, data writing can be carried out without being affected by stress or heat during pressure bonding of the antenna.

Embodiment 1

In this embodiment, as shown in FIG. 13A, an experiment of changing a distance between a pad 106 and a memory area 101 and thermocompressing an FPC (flexible printed circuit) that corresponds to an antenna in a position of the pad to examine an effect of thermocompression on a wireless chip, and a result thereof are shown. Specifically, a certain amount of data is written to the memory area, the FPC is thermocompressed, and then a change in data is measured. Further, whether data can be written accurately when writing is carried out again is measured.

As a condition for carrying out such measurements, a distance between the pad and an upper electrode of the memory area is set to be −1000 μm, 0 μm, 1000 μm, and 1500 μm. Note that the memory area points to a region in which an organic compound layer is actually formed, and the upper electrode is provided so as to cover the organic compound layer. The upper electrode and the organic compound layer are formed using a metal mask, and because of a margin or the metal mask, the upper electrode is formed so as to extend outside of the organic compound layer by about 500 μm to 1000 μm than the organic compound layer. In this embodiment, the margin is 750 μm; therefore, when the distance between the pad and the upper electrode of the memory area are −1000 μm, 0 μm, 1000 μm, and 1500 μm; d=−250 μm, d=750 μm, d=1750 μm, and d=2250 μm, respectively.

FIG. 13B shows the wireless chip 100 in a state in which the memory area 101 and the pad 106 overlap each other, and when d=−250 μm. In a case where the distance between the pad 106 and the memory area 101 (an edge of the upper electrode thereof) is negative, the FPC is thermocompressed to the pad while the memory area 101 and the pad 106 overlap each other by about 1000 μm.

FIG. 13C shows the wireless chip 100 in a state in which the edge of the upper electrode of the memory area 101 and an edge of the pad are in contact with each other, and when d=750 μm. In a case where the distance between the pad 106 and the memory area 101 (the edge of the upper electrode thereof) is 0, the FPC is thermocompressed to the pad while the edge of the upper electrode of the memory area 101 and the edge of the pad are in contact with each other.

Although a case when d=1750 μm or d=2250 μm is not shown in a figure, it is when distance d in FIG. 13A is 1750 μm or 2250 μm, and the FPC is thermocompressed to the pad while in this state.

Figures 14A, 14B:
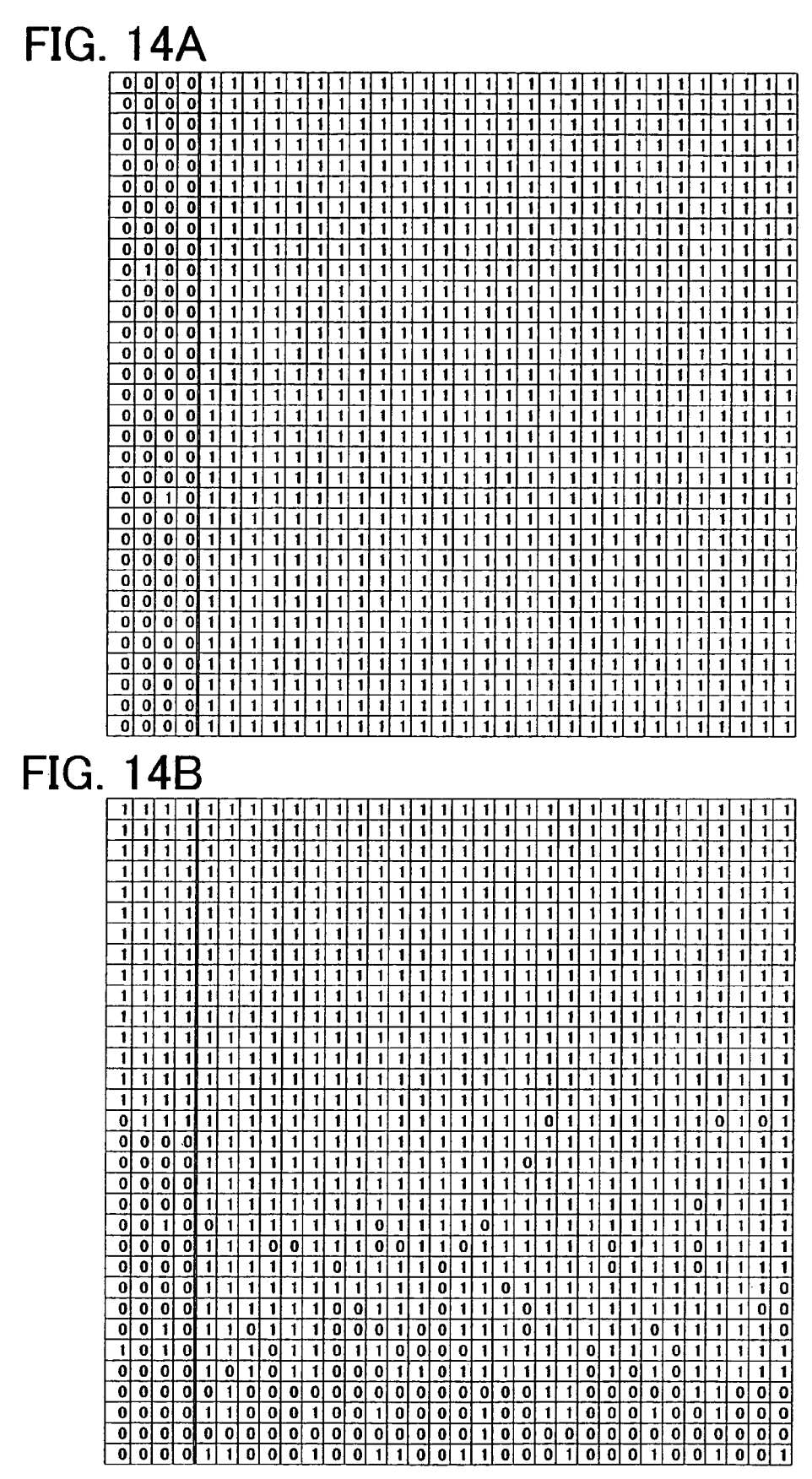

FIGS. 14A and 14B show a change in a written state of the memory area before and after the FPC is pressure-bonded, when d=−250 μm. FIG. 14A shows a state of the memory area before the FPC is pressure-bonded; further, writing is carried out with applied voltage of 10 V and for a writing time of 100 ms with respect to 128 memory cells in the memory area, so that writing is carried out with respect to 125 of the memory cells. Subsequently, a reader/writer device is used to determine whether a region is a region to which writing is carried out or not, by an existence or nonexistence of a reading signal. In the figure, a region in which writing is carried out is marked "0," and a region in which writing is not carried out is marked "0," and it is apparent that among 128 memory cells in the four leftmost columns in the figure, writing is carried out with respect to only 125 of the memory cells.

FIG. 14B shows a state of the foregoing memory area after the FPC is pressure-bonded. After thermocompressing the FPC in a position of the pad at 280° C., with a pressure of 50 kPa, and for 20 seconds, existence or nonexistence of a response is measured, and it is apparent that in a region of the four leftmost columns in the figure in which writing is carried out, a region that cannot be read is increased. The region that cannot be read is concentrated in an upper half of the memory area. It is speculated from a place where the FPC is pressure-bonded that the FPC is pressure-bonded in a lower half region of the memory area, and it can be considered that in the lower half, memory cells are destroyed by heat and pressure. Due to the destruction of the memory cells, it can be considered that it is in a written state. At this time, in the upper half of the memory area, an electrode lifts up due to the pressure applied to the lower half, and it can be considered that a situation is that data cannot be read.

In this manner, in the case where d=−250 μm, an extremely significant change occurs in the memory area.

Figures 15A, 15B, 15C:
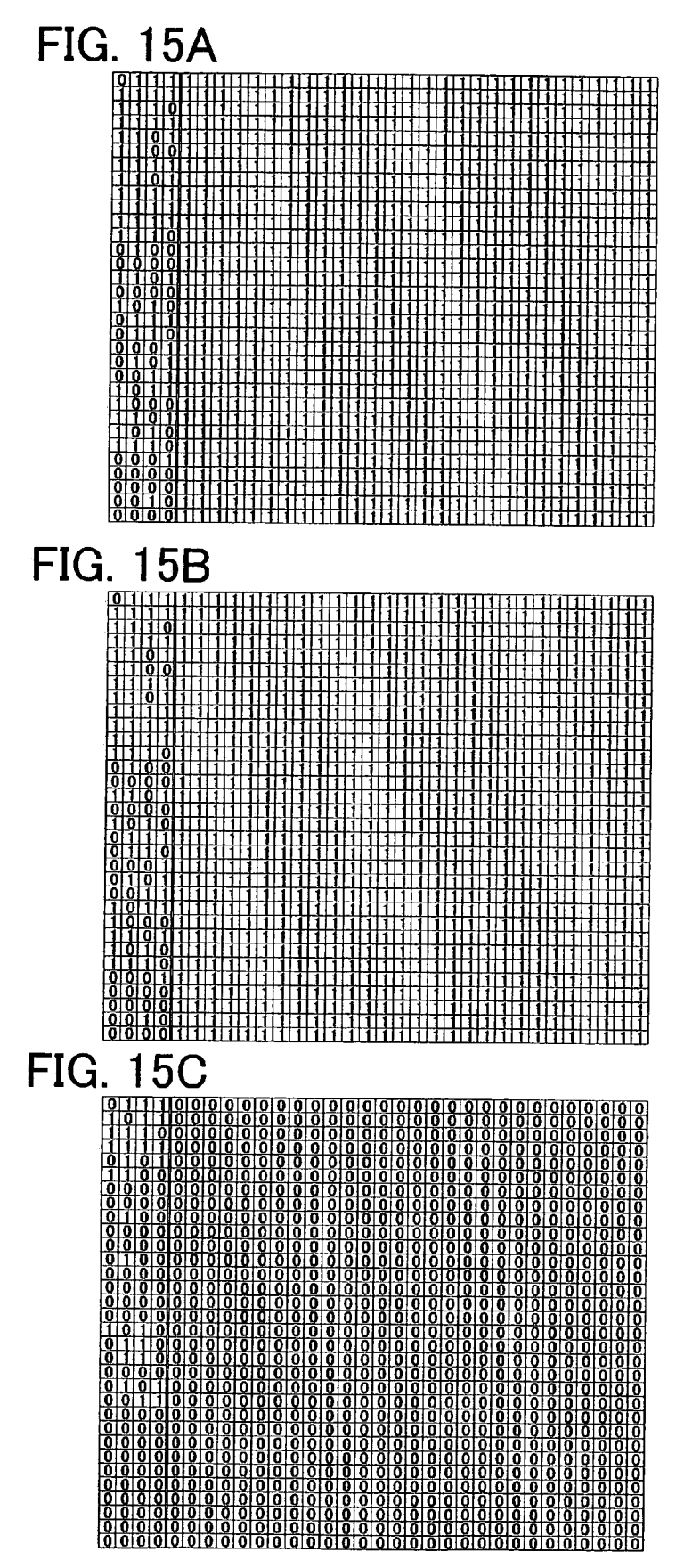

Subsequently, a change in a written state of the memory area before and after the FPC is pressure-bonded when d=750 μm is shown. FIG. 15A shows a state of the memory area before the FPC is pressure-bonded; further, writing is carried out with applied voltage of 9 V and for a writing time of 100 ms with respect to 128 memory cells in the memory area, so that writing is carried out with respect to 57 of the memory cells. The reason that the number of written memory cells is small is due to the applied voltage being low. Subsequently, a reader/writer device is used to determine whether a region is a region to which writing is carried out or not, by an existence or nonexistence of a reading signal. In a similar manner to FIGS. 14A and 14B, a region in which writing is carried out is marked "0," and a region in which writing is not carried out is marked "1," and it is apparent that among 128 memory cells in the four leftmost columns in the figure, writing is carried out with respect to only 57 of the memory cells.

FIG. 15B shows a result of measuring existence or nonexistence of a response using a reader/writer device, after thermocompressing the FPC in a position of the pad at a temperature of 280° C., with a pressure of 50 kPa, and for 20 seconds in a similar manner to the case where d=−250 μm. It is apparent that there is no change after pressure-bonding of the FPC.

FIG. 15C shows a state when writing is carried out again with respect to the entire memory area, with an applied voltage of 10 V and a writing time of 10 ms to 100 ms. In a similar manner to FIGS. 14A and 14B, a region in which writing is carried out is marked "0," and a region in which writing is not carried out is marked "1," and it is apparent that among all memory cells, writing is carried out with respect to 995 of the memory cells. By carrying out writing again, an effect of pressure-bonding of the FPC on writing can be examined. Further, whether there is substantial change in writing voltage or not can be examined. In this experiment, it is determined that writing is carried out normally, and that the writing voltage is not affected by pressure-bonding of the FPC.

Figures 16A, 16B, 16C:
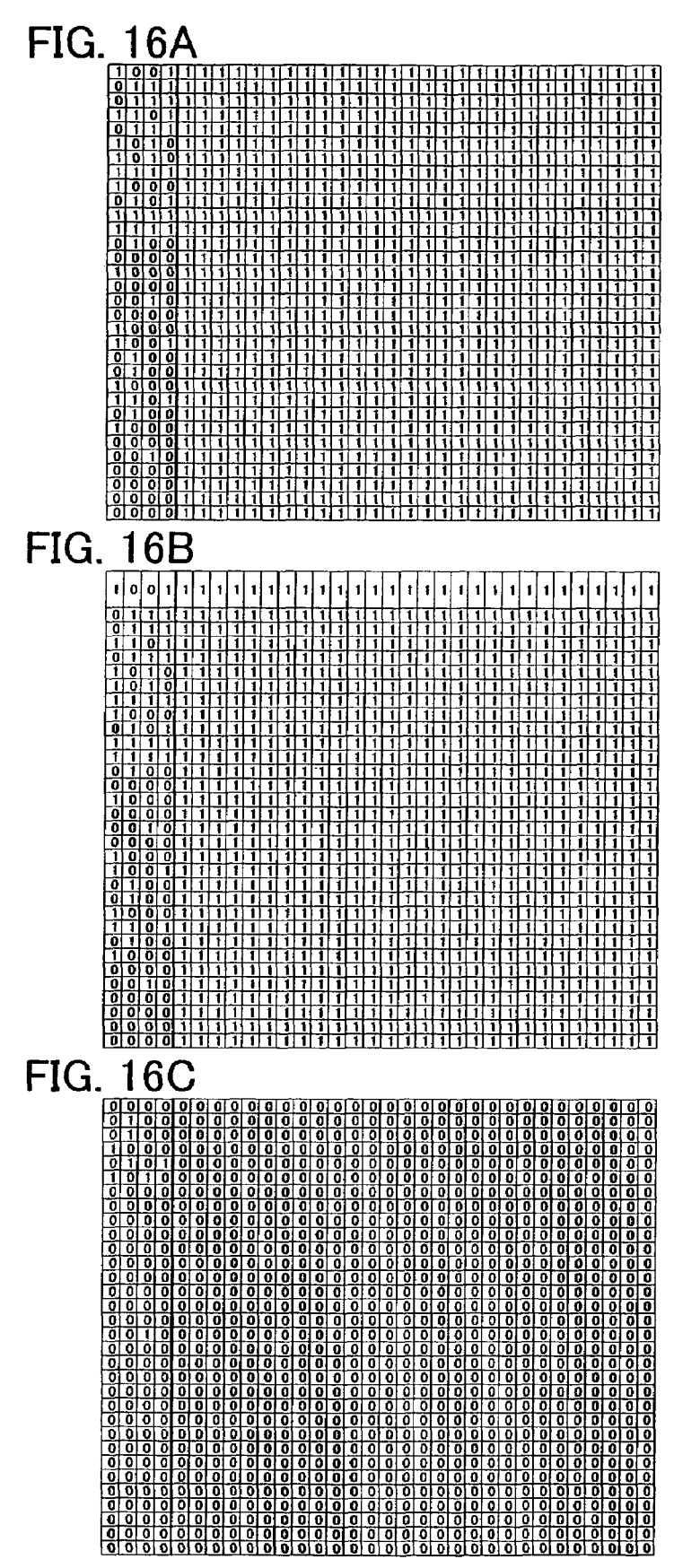

Subsequently, a change in a written state of the memory area before and after the FPC is pressure-bonded when d=1750 μm is shown. FIG. 16A shows a state of the memory area before the FPC is pressure-bonded; further, writing is carried out with applied voltage of 9 V and for a writing time of 100 ms with respect to 128 memory cells in the memory area, so that writing is carried out with respect to 80 of the memory cells. Subsequently, a reader/writer device is used to determine whether a region is a region to which writing is carried out or not, by an existence or nonexistence of a reading signal. In a similar manner to FIGS. 14A and 14B, a region in which writing is carried out is marked "0," and a region in which writing is not carried out is marked "1," and it is apparent that among 128 memory cells in the four leftmost columns in the figure, writing is carried out with respect to only 80 of the memory cells.

FIG. 16B shows a result of measuring existence or nonexistence of a response using a reader/writer device, after thermocompressing the FPC in a position of the pad at a temperature of 280° C., with a pressure of 50 kPa, and for 20 seconds in a similar manner to the case where d=−250 μm. It is apparent that there is no change after pressure-bonding of the FPC.

FIG. 16C shows a state when writing is carried out again with respect to the entire memory area, with an applied voltage of 10 V and a writing time of 10 ms to 100 ms. In a similar manner to FIGS. 14A and 14B, a region in which writing is carried out is marked "0," and a region in which writing is not carried out is marked "1," and it is apparent that among all memory cells, writing is carried out with respect to 1016 of the memory cells. By carrying out writing again, an effect of pressure-bonding of the FPC on writing can be examined. Further, whether there is substantial change in writing voltage or not can be examined. In this experiment, it is determined that writing is carried out normally, and that the writing voltage is not affected by pressure-bonding of the FPC.

Figures 17A, 17B, 17C:
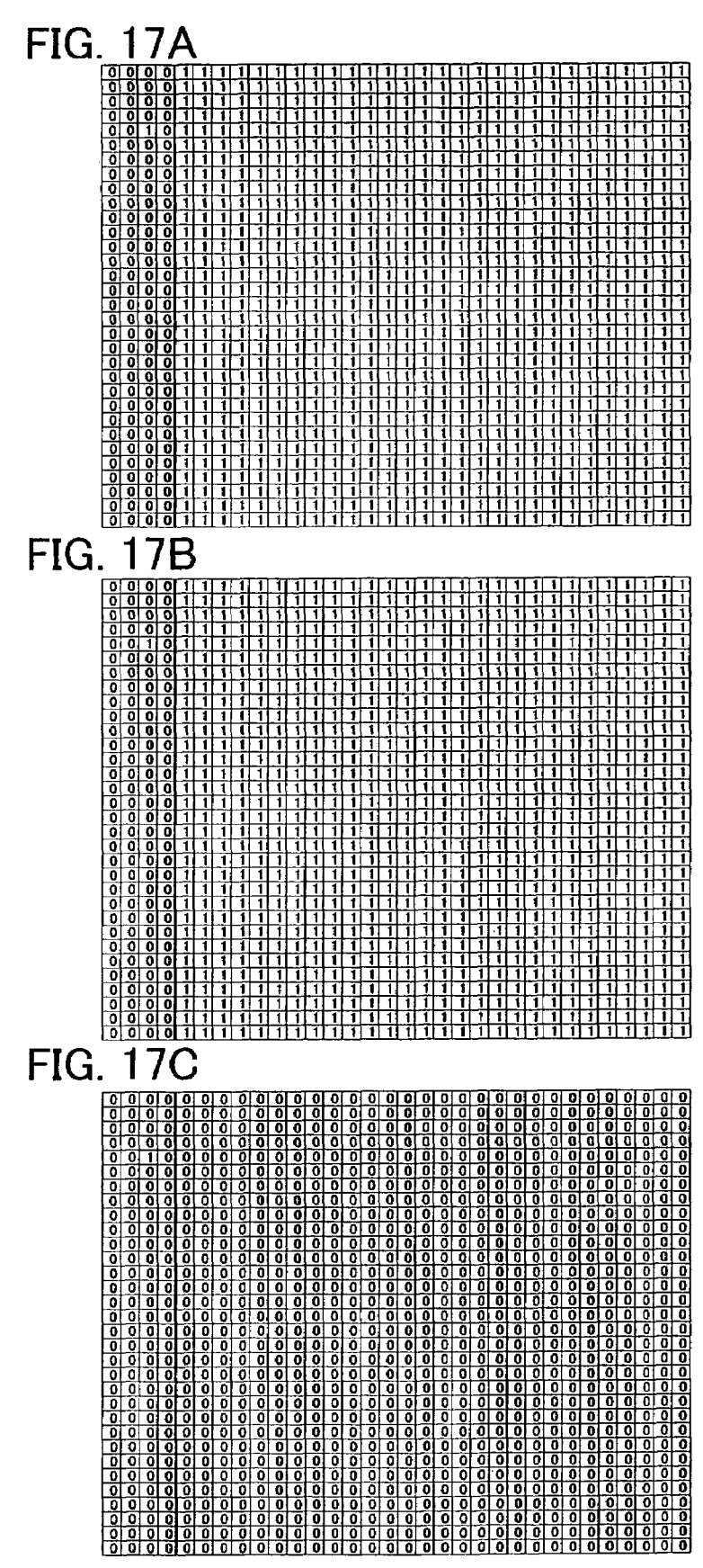

Subsequently, a change in a written state of the memory area before and after the FPC is pressure-bonded when d=2250 μm is shown. FIG. 17A shows a state of the memory area before the FPC is pressure-bonded; further, writing is carried out with applied voltage of 9 V and for a writing time of 100 ms with respect to 128 memory cells in the memory area, so that writing is carried out with respect to 127 of the memory cells. Subsequently, a reader/writer device is used to determine whether a region is a region to which writing is carried out or not, by an existence or nonexistence of a reading signal. In a similar manner to FIGS. 14A and 14B, a region in which writing is carried out is marked "0," and a region in which writing is not carried out is marked "1," and it is apparent that among 128 memory cells in the four leftmost columns in the figure, writing is carried out with respect to only 127 of the memory cells.

FIG. 17B shows a result of measuring existence or nonexistence of a response using a reader/writer device, after thermocompressing the FPC in a position of the pad at a temperature of 280° C., with a pressure of 50 kPa, and for 20 seconds in a similar manner to the case where d=−250 μm. It is apparent that there is no change after pressure-bonding of the FPC.

FIG. 17C shows a state when writing is carried out again with respect to the entire memory area, with an applied voltage of 10 V and a writing time of 10 ms to 100 ms. In a similar manner to FIGS. 14A and 14B, a region in which writing is carried out is marked "0," and a region in which writing is not carried out is marked "1," and it is apparent that among all memory cells, writing is carried out with respect to 1023 of the memory cells. By carrying out writing again, an effect of pressure-bonding of the FPC on writing can be examined. Further, whether there is substantial change in writing voltage or not can be examined. In this experiment, it is determined that writing is carried out normally, and that the writing voltage is not affected by pressure-bonding of the FPC.

From such results, it is apparent that the distance between the pad and the memory area is favorably 500 μm or longer, preferably 750 μm or longer, or from 500 μm to 1 mm when expressed as a range.

This application is based on Japanese Patent Application serial no. 2005-340981 filed in Japan Patent Office on Nov. 25 in 2005, the entire contents of which are hereby incorporated by reference.

What is claimed is:

1. A semiconductor device comprising:
    an antenna for carrying out wireless communication;
    a logic circuit portion connected to the antenna;
    a high frequency circuit portion connected to the antenna;
    a memory circuit portion configured to be controlled by the logic circuit portion; and
    a pad portion connecting the high frequency circuit portion and the antenna,
    wherein one end portion of the memory circuit portion and one end portion of the pad portion have a distance of at least 500 μm or longer in linear distance therebetween, and
    wherein the memory circuit portion includes an organic memory element.

2. The semiconductor device according to claim 1, wherein the antenna has a straight line shape.

3. The semiconductor device according to claim 1, wherein the antenna has a coil shape.

4. The semiconductor device according to claim 1, wherein the antenna is provided over an antenna substrate and pressure-bonded to the pad portion.

5. The semiconductor device according to claim 1, wherein the antenna is pressure-bonded to the pad portion using an anisotropic conductive film.

6. The semiconductor device according to claim 1, wherein the memory circuit portion includes a plurality of memory cells, and each of the memory cells includes a switching element and a memory element.

7. The semiconductor device according to claim 6, wherein the memory element includes an organic compound layer between a first conductive layer that structures a bit line and a second conductive layer that structures a word line.

8. The semiconductor device according to claim 1, further comprising an external signal input portion for writing signals in the memory circuit portion.

9. A semiconductor device comprising:
    an antenna for carrying out wireless communication;
    a logic circuit portion and a high frequency circuit portion connected to the antenna;
    a memory circuit portion controlled by the logic circuit portion; and
    a pad portion connecting the high frequency circuit portion and the antenna,
    wherein one end portion of the memory circuit portion and one end portion of the pad portion have a distance of at least 750 μm or longer in linear distance therebetween, and
    wherein the memory circuit portion includes an organic memory element.

10. The semiconductor device according to claim 9, wherein the antenna has a straight line shape.

11. The semiconductor device according to claim 9, wherein the antenna has a coil shape.

12. The semiconductor device according to claim 9, wherein the antenna is provided over an antenna substrate and pressure-bonded to the pad portion.

13. The semiconductor device according to claim 9, wherein the antenna is pressure-bonded to the pad portion using an anisotropic conductive film.

14. The semiconductor device according to claim 9, wherein the memory circuit portion includes a plurality of memory cells, and each of the memory cells includes a switching element and a memory element.

15. The semiconductor device according to claim 14, wherein the memory element includes an organic compound layer between a first conductive layer that structures a bit line and a second conductive layer that structures a word line.

16. The semiconductor device according to claim 9, further comprising an external signal input portion for writing signals in the memory circuit portion.

17. A semiconductor device comprising:
    an antenna for carrying out wireless communication;
    a logic circuit portion and a high frequency circuit portion connected to the antenna;
    a memory circuit portion controlled by the logic circuit portion; and
    a pad portion connecting the high frequency circuit portion and the antenna,
    wherein one end portion of the memory circuit portion and one end portion of the pad portion have a distance of 500 μm to 1 mm in linear distance therebetween, and
    wherein the memory circuit portion includes an organic memory element.

18. The semiconductor device according to claim 17, wherein the antenna has a straight line shape.

19. The semiconductor device according to claim 17, wherein the antenna has a coil shape.

20. The semiconductor device according to claim 17, wherein the antenna is provided over an antenna substrate and pressure-bonded to the pad portion.

21. The semiconductor device according to claim 17, wherein the antenna is pressure-bonded to the pad portion using an anisotropic conductive film.

22. The semiconductor device according to claim 17, wherein the memory circuit portion includes a plurality of memory cells, and each of the memory cells includes a switching element and a memory element.

23. The semiconductor device according to claim 22, wherein the memory element includes an organic compound layer between a first conductive layer that structures a bit line and a second conductive layer that structures a word line.

24. The semiconductor device according to claim 17, further comprising an external signal input portion for writing signals in the memory circuit portion.

* * * * *